US011428738B2

(12) United States Patent
Novak, III et al.

(10) Patent No.: US 11,428,738 B2
(45) Date of Patent: *Aug. 30, 2022

(54) AEROSOL DELIVERY DEVICE

(71) Applicant: RAI Strategic Holdings, Inc., Winston-Salem, NC (US)

(72) Inventors: Charles Jacob Novak, III, Winston-Salem, NC (US); Frederic Philippe Ampolini, Winston-Salem, NC (US); Allen Michael East, Cary, NC (US); Raymond C. Henry, Cary, NC (US); William Robert Collett, Lexington, NC (US)

(73) Assignee: RAI Strategic Holdings, Inc., Winston-Salem, NC (US)

( * ) Notice: Subject to any disclaimer, the term of this patent is extended or adjusted under 35 U.S.C. 154(b) by 119 days.

This patent is subject to a terminal disclaimer.

(21) Appl. No.: 16/931,047

(22) Filed: Jul. 16, 2020

(65) Prior Publication Data
US 2020/0348362 A1 Nov. 5, 2020

Related U.S. Application Data

(63) Continuation of application No. 16/353,864, filed on Mar. 14, 2019, now Pat. No. 10,753,974, which is a (Continued)

(51) Int. Cl.
*A24F 47/00* (2020.01)
*G01R 31/327* (2006.01)
(Continued)

(52) U.S. Cl.
CPC ............ *G01R 31/327* (2013.01); *A24F 40/40* (2020.01); *A24F 40/50* (2020.01); *A24F 40/53* (2020.01); *A24F 40/10* (2020.01)

(58) Field of Classification Search
CPC .................................. A24F 40/50; A24F 40/53
See application file for complete search history.

(56) References Cited

U.S. PATENT DOCUMENTS

| 1,771,366 A | 7/1930 | Wyss et al. |
| 2,057,353 A | 10/1936 | Whittemore, Jr. |
(Continued)

FOREIGN PATENT DOCUMENTS

| AU | 276250 | 7/1965 |
| CA | 2 641 869 | 5/2010 |
(Continued)

OTHER PUBLICATIONS

"(±)-nicotine," ChemSpider, [online], 2019, retrieved from the Internet, [retrieved Jan. 16, 2019], <URL: http://www.chemspider.com/Chemical-Sttucture.917.html>. (Year: 2019).
(Continued)

*Primary Examiner* — Eric Yaary
(74) *Attorney, Agent, or Firm* — Womble Bond Dickinson (US) LLP

(57) ABSTRACT

The present disclosure relates to articles (and the manufacture thereof) that use electrical energy to heat a material to form an inhalable substance, the articles being sufficiently compact to be considered "hand-held" devices. In certain embodiments, the articles can particularly be characterized as smoking articles. The smoking article can be adapted to detect the status of a cartridge portion of the smoking article. The smoking article includes a control body portion having a control body engagement end, wherein the control body portion houses a control component and a power source therein. The article further includes a cartridge body portion that has a cartridge body engagement end configured to removably engage the control body engagement end of the control body portion. The cartridge body portion houses a consumable arrangement and a heating connection operably
(Continued)

engaged therewith comprising at least one heating element and a fusible link.

22 Claims, 4 Drawing Sheets

Related U.S. Application Data continuation of application No. 16/019,081, filed on Jun. 26, 2018, now Pat. No. 10,274,539, which is a continuation of application No. 13/788,455, filed on Mar. 7, 2013, now Pat. No. 10,031,183.

(51) Int. Cl.
  A24F 40/50 (2020.01)
  A24F 40/40 (2020.01)
  A24F 40/53 (2020.01)
  A24F 40/10 (2020.01)

(56) References Cited

U.S. PATENT DOCUMENTS

| | | |
|---|---|---|
| 2,104,266 A | 1/1938 | McCormick |
| 2,805,669 A | 9/1957 | Meriro |
| 3,111,396 A | 11/1963 | Ball |
| 3,200,819 A | 8/1965 | Gilbert |
| 3,316,919 A | 5/1967 | Green et al. |
| 3,398,754 A | 8/1968 | Tughan |
| 3,419,015 A | 12/1968 | Wochnowski |
| 3,424,171 A | 1/1969 | Rooker |
| 3,476,118 A | 11/1969 | Luttich |
| 4,054,145 A | 10/1977 | Berndt et al. |
| 4,131,117 A | 12/1978 | Kite et al. |
| 4,150,677 A | 4/1979 | Osborne |
| 4,190,046 A | 2/1980 | Virag |
| 4,219,032 A | 8/1980 | Tabatznik et al. |
| 4,259,970 A | 4/1981 | Green, Jr. |
| 4,284,089 A | 8/1981 | Ray |
| 4,303,083 A | 12/1981 | Burruss, Jr. |
| 4,449,541 A | 5/1984 | Mays et al. |
| 4,506,682 A | 3/1985 | Muller |
| 4,635,651 A | 1/1987 | Jacobs |
| 4,674,519 A | 6/1987 | Keritsis et al. |
| 4,708,151 A | 11/1987 | Shelar |
| 4,714,082 A | 12/1987 | Banerjee et al. |
| 4,735,217 A | 4/1988 | Gerth et al. |
| 4,756,318 A | 7/1988 | Clearman et al. |
| 4,771,795 A | 9/1988 | White et al. |
| 4,776,353 A | 10/1988 | Lilja et al. |
| 4,793,365 A | 12/1988 | Sensabaugh, Jr. et al. |
| 4,800,903 A | 1/1989 | Ray et al. |
| 4,819,665 A | 4/1989 | Roberts et al. |
| 4,821,749 A | 4/1989 | Toft et al. |
| 4,830,028 A | 5/1989 | Lawson et al. |
| 4,836,224 A | 6/1989 | Lawson et al. |
| 4,836,225 A | 6/1989 | Sudoh |
| 4,848,374 A | 7/1989 | Chard et al. |
| 4,848,376 A | 7/1989 | Lilja et al. |
| 4,874,000 A | 10/1989 | Tamol et al. |
| 4,880,018 A | 11/1989 | Graves, Jr. et al. |
| 4,887,619 A | 12/1989 | Burcham, Jr. et al. |
| 4,907,606 A | 3/1990 | Lilja et al. |
| 4,913,168 A | 4/1990 | Potter et al. |
| 4,917,119 A | 4/1990 | Potter et al. |
| 4,917,128 A | 4/1990 | Clearman et al. |
| 4,922,901 A | 5/1990 | Brooks et al. |
| 4,924,888 A | 5/1990 | Perfetti et al. |
| 4,928,714 A | 5/1990 | Shannon |
| 4,938,236 A | 7/1990 | Banerjee et al. |
| 4,941,483 A | 7/1990 | Ridings et al. |
| 4,941,484 A | 7/1990 | Clapp et al. |
| 4,945,931 A | 8/1990 | Gori |
| 4,947,874 A | 8/1990 | Brooks et al. |
| 4,947,875 A | 8/1990 | Brooks et al. |
| 4,972,854 A | 11/1990 | Kiernan et al. |
| 4,972,855 A | 11/1990 | Kuriyama et al. |
| 4,986,286 A | 1/1991 | Roberts et al. |
| 4,987,906 A | 1/1991 | Young et al. |
| 5,005,593 A | 4/1991 | Fagg |
| 5,019,122 A | 5/1991 | Clearman et al. |
| 5,022,416 A | 6/1991 | Watson |
| 5,027,837 A | 7/1991 | Clearman et al. |
| 5,042,510 A | 8/1991 | Curtiss et al. |
| 5,060,671 A | 8/1991 | Counts et al. |
| 5,056,537 A | 10/1991 | Brown et al. |
| 5,060,669 A | 10/1991 | White et al. |
| 5,065,775 A | 11/1991 | Fagg |
| 5,072,744 A | 12/1991 | Luke et al. |
| 5,074,319 A | 12/1991 | White et al. |
| 5,076,296 A | 12/1991 | Nystrom et al. |
| 5,093,894 A | 3/1992 | Deevi et al. |
| 5,095,921 A | 3/1992 | Losee et al. |
| 5,097,850 A | 3/1992 | Bmunshteyn et al. |
| 5,099,862 A | 3/1992 | White et al. |
| 5,099,864 A | 3/1992 | Young et al. |
| 5,103,842 A | 4/1992 | Strang et al. |
| 5,121,757 A | 6/1992 | White et al. |
| 5,129,409 A | 7/1992 | White et al. |
| 5,131,415 A | 7/1992 | Munoz et al. |
| 5,144,962 A | 8/1992 | Counts et al. |
| 5,143,097 A | 9/1992 | Sohn et al. |
| 5,146,934 A | 9/1992 | Deevi et al. |
| 5,159,940 A | 11/1992 | Hayward et al. |
| 5,159,942 A | 11/1992 | Brinkley et al. |
| 5,179,966 A | 1/1993 | Losee et al. |
| 5,211,684 A | 5/1993 | Shannon et al. |
| 5,220,930 A | 6/1993 | Gentry |
| 5,224,498 A | 7/1993 | Deevi et al. |
| 5,228,460 A | 7/1993 | Sprinkel, Jr. et al. |
| 5,230,354 A | 7/1993 | Smith et al. |
| 5,235,992 A | 8/1993 | Sensabaugh |
| 5,243,999 A | 9/1993 | Smith |
| 5,246,018 A | 9/1993 | Deevi et al. |
| 5,249,586 A | 10/1993 | Morgan et al. |
| 5,261,424 A | 11/1993 | Sprinkel, Jr. |
| 5,269,327 A | 12/1993 | Counts et al. |
| 5,285,798 A | 2/1994 | Banerjee et al. |
| 5,293,883 A | 3/1994 | Edwards |
| 5,301,694 A | 4/1994 | Raymond |
| 5,303,720 A | 4/1994 | Banerjee et al. |
| 5,318,050 A | 6/1994 | Gonzalez-Parra et al. |
| 5,322,075 A | 6/1994 | Deevi et al. |
| 5,322,076 A | 6/1994 | Brinkley et al. |
| 5,339,838 A | 8/1994 | Young et al. |
| 5,345,951 A | 9/1994 | Serrano et al. |
| 5,353,813 A | 10/1994 | Deevi et al. |
| 5,357,984 A | 10/1994 | Farrier et al. |
| 5,360,023 A | 11/1994 | Blaldey et al. |
| 5,369,723 A | 11/1994 | Counts et al. |
| 5,372,148 A | 12/1994 | McCafferty et al. |
| 5,377,698 A | 1/1995 | Litzinger et al. |
| 5,388,574 A | 2/1995 | Ingebrethsen et al. |
| 5,388,594 A | 2/1995 | Counts et al. |
| 5,408,574 A | 4/1995 | Deevi et al. |
| 5,435,325 A | 7/1995 | Clapp et al. |
| 5,445,169 A | 8/1995 | Brinkley et al. |
| 5,449,117 A | 9/1995 | Muderlak et al. |
| 5,468,266 A | 11/1995 | Bensalem et al. |
| 5,468,936 A | 11/1995 | Deevi et al. |
| 5,479,948 A | 1/1996 | Counts et al. |
| 5,495,859 A | 3/1996 | Bowen et al. |
| 5,498,850 A | 3/1996 | Das |
| 5,498,855 A | 3/1996 | Deevi et al. |
| 5,499,636 A | 3/1996 | Bagged, Jr. et al. |
| 5,501,237 A | 3/1996 | Young et al. |
| 5,505,214 A | 4/1996 | Collins et al. |
| 5,515,842 A | 5/1996 | Ramseyer et al. |
| 5,530,225 A | 6/1996 | Hajaligol |
| 5,551,450 A | 9/1996 | Hemsley |
| 5,551,451 A | 9/1996 | Riggs et al. |
| 5,564,442 A | 10/1996 | MacDonald et al. |
| 5,573,692 A | 11/1996 | Das et al. |
| 5,591,368 A | 1/1997 | Fleischhauer et al. |

(56) References Cited

U.S. PATENT DOCUMENTS

| | | |
|---|---|---|
| 5,593,792 A | 1/1997 | Farrier et al. |
| 5,595,577 A | 1/1997 | Bensalem et al. |
| 5,596,706 A | 1/1997 | Sikk et al. |
| 5,611,360 A | 3/1997 | Tang |
| 5,613,504 A | 3/1997 | Collins et al. |
| 5,613,505 A | 3/1997 | Campbell et al. |
| 5,649,552 A | 7/1997 | Cho et al. |
| 5,649,554 A | 7/1997 | Sprinkel et al. |
| 5,659,656 A | 8/1997 | Das |
| 5,665,262 A | 9/1997 | Hajaligol et al. |
| 5,666,976 A | 9/1997 | Adams et al. |
| 5,666,977 A | 9/1997 | Higgins et al. |
| 5,666,978 A | 9/1997 | Counts et al. |
| 5,692,525 A | 12/1997 | Counts et al. |
| 5,692,526 A | 12/1997 | Adams et al. |
| 5,708,258 A | 1/1998 | Counts et al. |
| 5,711,320 A | 1/1998 | Martin |
| 5,726,421 A | 3/1998 | Fleischhauer et al. |
| 5,727,571 A | 3/1998 | Meiring et al. |
| 5,730,158 A | 3/1998 | Collins et al. |
| 5,750,964 A | 5/1998 | Counts et al. |
| 5,799,663 A | 9/1998 | Gross et al. |
| 5,816,263 A | 10/1998 | Counts et al. |
| 5,819,756 A | 10/1998 | Mielordt |
| 5,829,453 A | 11/1998 | White et al. |
| 5,865,185 A | 2/1999 | Collins et al. |
| 5,865,186 A | 2/1999 | Volsey, II |
| 5,878,752 A | 3/1999 | Adams et al. |
| 5,880,439 A | 3/1999 | Deevi et al. |
| 5,894,841 A | 4/1999 | Voges |
| 5,915,387 A | 6/1999 | Baggett, Jr. et al. |
| 5,934,289 A | 8/1999 | Watkins et al. |
| 5,954,979 A | 9/1999 | Counts et al. |
| 5,967,148 A | 10/1999 | Harris et al. |
| 6,026,820 A | 2/2000 | Baggett, Jr. et al. |
| 6,033,623 A | 3/2000 | Deevi et al. |
| 6,040,560 A | 3/2000 | Fleischhauer et al. |
| 6,053,176 A | 4/2000 | Adams et al. |
| 6,089,857 A | 7/2000 | Matsuura et al. |
| 6,095,153 A | 8/2000 | Kessler et al. |
| 6,116,247 A | 9/2000 | Banyasz et al. |
| 6,119,700 A | 9/2000 | Fleischhauer et al. |
| 6,125,853 A | 10/2000 | Susa et al. |
| 6,125,855 A | 10/2000 | Nevett et al. |
| 6,125,866 A | 10/2000 | Nichols et al. |
| 6,155,268 A | 12/2000 | Takeuchi |
| 6,164,287 A | 12/2000 | White |
| 6,182,670 B1 | 2/2001 | White |
| 6,196,218 B1 | 3/2001 | Voges |
| 6,196,219 B1 | 3/2001 | Hess et al. |
| 6,216,706 B1 | 4/2001 | Kumar et al. |
| 6,289,898 B1 | 9/2001 | Fournier et al. |
| 6,349,729 B1 | 2/2002 | Pham |
| 6,357,671 B1 | 3/2002 | Cewers |
| 6,418,938 B1 | 7/2002 | Fleischhauer et al. |
| 6,446,426 B1 | 8/2002 | Sweeney et al. |
| 6,532,965 B1 | 3/2003 | Abhulimen et al. |
| 6,598,607 B2 | 7/2003 | Adiga et al. |
| 6,601,776 B1 | 8/2003 | Oljaca et al. |
| 6,615,840 B1 | 9/2003 | Fournier et al. |
| 6,652,442 B2 | 11/2003 | Gatto |
| 6,688,313 B2 | 2/2004 | Wrenn et al. |
| 6,701,936 B2 | 3/2004 | Shafer et al. |
| 6,715,494 B1 | 4/2004 | McCoy |
| 6,730,832 B1 | 5/2004 | Dominguez et al. |
| 6,722,756 B2 | 8/2004 | Shayan |
| 6,772,756 B2 | 8/2004 | Shayan |
| 6,803,545 B2 | 10/2004 | Blake et al. |
| 6,803,550 B2 | 10/2004 | Sharpe et al. |
| 6,810,883 B2 | 11/2004 | Felter et al. |
| 6,854,461 B2 | 2/2005 | Nichols et al. |
| 6,854,470 B1 | 2/2005 | Pu |
| 6,994,096 B2 | 2/2006 | Rostami et al. |
| 7,011,096 B2 | 3/2006 | Li et al. |
| 7,017,585 B2 | 3/2006 | Li et al. |
| 7,025,066 B2 | 4/2006 | Lawson et al. |
| 7,117,867 B2 | 10/2006 | Cox et al. |
| 7,131,599 B2 | 11/2006 | Katase |
| 7,163,015 B2 | 1/2007 | Moffitt |
| 7,173,322 B2 | 2/2007 | Cox et al. |
| 7,185,659 B2 | 3/2007 | Sharpe et al. |
| 7,234,470 B2 | 6/2007 | Yang |
| 7,290,549 B2 | 11/2007 | Banerjee et al. |
| 7,293,565 B2 | 11/2007 | Griffin et al. |
| 7,392,809 B2 | 7/2008 | Larson et al. |
| 7,513,253 B2 | 4/2009 | Kobayashi et al. |
| 7,647,932 B2 | 1/2010 | Cantrell et al. |
| 7,690,385 B2 | 4/2010 | Moffitt |
| 7,692,123 B2 | 4/2010 | Baba et al. |
| 7,726,320 B2 | 6/2010 | Robinson et al. |
| 7,775,459 B2 | 8/2010 | Martens, III et al. |
| 7,810,505 B2 | 10/2010 | Yang |
| 7,832,410 B2 | 11/2010 | Hon |
| 7,845,359 B2 | 12/2010 | Montaser |
| 7,878,209 B2 | 2/2011 | Newbery et al. |
| 7,896,006 B2 | 3/2011 | Hamano et al. |
| 8,066,010 B2 | 11/2011 | Newbery et al. |
| 8,079,371 B2 | 12/2011 | Robinson et al. |
| 8,127,772 B2 | 3/2012 | Montaser |
| 8,156,944 B2 | 4/2012 | Han |
| 8,365,742 B2 | 2/2013 | Hon |
| 8,375,957 B2 | 2/2013 | Hon |
| 8,393,331 B2 | 3/2013 | Hon |
| 8,499,766 B1 | 8/2013 | Newton |
| 8,528,569 B1 | 9/2013 | Newton |
| 2002/0146242 A1 | 10/2002 | Vieira |
| 2002/0164169 A1 | 11/2002 | Arai et al. |
| 2002/0194064 A1 | 12/2002 | Party et al. |
| 2003/0017203 A1 | 1/2003 | Crotts et al. |
| 2003/0131859 A1 | 7/2003 | Li et al. |
| 2003/0209245 A1 | 11/2003 | Poole et al. |
| 2003/0226837 A1 | 12/2003 | Blake et al. |
| 2004/0017203 A1 | 1/2004 | Becker et al. |
| 2004/0020500 A1 | 2/2004 | Wrenn et al. |
| 2004/0129280 A1 | 7/2004 | Woodson et al. |
| 2004/0149296 A1 | 8/2004 | Rostami et al. |
| 2004/0200488 A1 | 10/2004 | Felter et al. |
| 2004/0224435 A1 | 11/2004 | Shibata et al. |
| 2004/0226568 A1 | 11/2004 | Takeuchi et al. |
| 2004/0255965 A1 | 12/2004 | Perfetti et al. |
| 2004/0261790 A1 | 12/2004 | Joshi et al. |
| 2005/0016549 A1 | 1/2005 | Banerjee et al. |
| 2005/0016550 A1 | 1/2005 | Katase |
| 2005/0066986 A1 | 3/2005 | Nestor et al. |
| 2005/0151126 A1 | 7/2005 | Yamakawa et al. |
| 2005/0157578 A1 | 7/2005 | Noguchi et al. |
| 2005/0172118 A1 | 8/2005 | Nasu |
| 2005/0172976 A1 | 8/2005 | Newman et al. |
| 2005/0228991 A1 | 10/2005 | Schmit |
| 2005/0235991 A1 | 10/2005 | Nichols et al. |
| 2005/0274390 A1 | 12/2005 | Banerjee et al. |
| 2006/0016453 A1 | 1/2006 | Kim |
| 2006/0032501 A1 | 2/2006 | Hale et al. |
| 2006/0070633 A1 | 4/2006 | Rostami et al. |
| 2006/0162733 A1 | 7/2006 | McGrath et al. |
| 2006/0185687 A1 | 8/2006 | Hearn et al. |
| 2006/0196518 A1 | 9/2006 | Hon |
| 2007/0062548 A1 | 3/2007 | Horstmann et al. |
| 2007/0074734 A1 | 4/2007 | Braunshteyn et al. |
| 2007/0102013 A1 | 5/2007 | Adams et al. |
| 2007/0215167 A1 | 9/2007 | Crooks et al. |
| 2007/0283972 A1 | 12/2007 | Monsees et al. |
| 2008/0092912 A1 | 4/2008 | Robinson et al. |
| 2008/0149118 A1 | 6/2008 | Oglesby et al. |
| 2008/0245377 A1 | 10/2008 | Marshall et al. |
| 2008/0257367 A1 | 10/2008 | Paterno et al. |
| 2008/0262414 A1 | 10/2008 | Barsness et al. |
| 2008/0276947 A1 | 11/2008 | Martzel |
| 2008/0302374 A1 | 12/2008 | Wengert et al. |
| 2009/0065010 A1 | 3/2009 | Shands |
| 2009/0095311 A1 | 4/2009 | Hon |
| 2009/0095312 A1 | 4/2009 | Herbrich et al. |
| 2009/0126745 A1 | 5/2009 | Hon |
| 2009/0151717 A1 | 6/2009 | Bowen et al. |

(56) References Cited

U.S. PATENT DOCUMENTS

| | | |
|---|---|---|
| 2009/0188490 A1 | 7/2009 | Han |
| 2009/0230117 A1 | 9/2009 | Fernando et al. |
| 2009/0260641 A1 | 10/2009 | Monsees et al. |
| 2009/0260642 A1 | 10/2009 | Monsees et al. |
| 2009/0272379 A1 | 11/2009 | Thorens et al. |
| 2009/0283103 A1 | 11/2009 | Nielsen et al. |
| 2009/0293892 A1 | 12/2009 | Williams et al. |
| 2009/0320863 A1 | 12/2009 | Fernando et al. |
| 2009/0324206 A1 | 12/2009 | Young et al. |
| 2010/0006113 A1 | 1/2010 | Urtsev et al. |
| 2010/0024834 A1 | 2/2010 | Oglesby et al. |
| 2010/0043809 A1 | 2/2010 | Magnon |
| 2010/0059070 A1 | 3/2010 | Potter et al. |
| 2010/0059073 A1 | 3/2010 | Hoffmann et al. |
| 2010/0065075 A1 | 3/2010 | Baneijee et al. |
| 2010/0083959 A1 | 4/2010 | Siller |
| 2010/0163063 A1 | 7/2010 | Fernando et al. |
| 2010/0200006 A1 | 8/2010 | Robinson et al. |
| 2010/0229881 A1 | 9/2010 | Hearn |
| 2010/0242974 A1 | 9/2010 | Pan |
| 2010/0242976 A1 | 9/2010 | Katayama et al. |
| 2010/0258139 A1 | 10/2010 | Onishi et al. |
| 2010/0300467 A1 | 12/2010 | Kuistilla et al. |
| 2010/0307518 A1 | 12/2010 | Wang |
| 2010/0313901 A1 | 12/2010 | Fernando et al. |
| 2011/0005535 A1 | 1/2011 | Xiu |
| 2011/0011396 A1 | 1/2011 | Fang |
| 2011/0036346 A1 | 2/2011 | Cohen et al. |
| 2011/0036363 A1 | 2/2011 | Urtsev et al. |
| 2011/0036365 A1 | 2/2011 | Chong et al. |
| 2011/0073121 A1 | 3/2011 | Levin et al. |
| 2011/0080297 A1 | 4/2011 | Broncano Atencia et al. |
| 2011/0088707 A1 | 4/2011 | Hajaligol |
| 2011/0094523 A1 | 4/2011 | Thorens et al. |
| 2011/0120480 A1 | 5/2011 | Brenneise |
| 2011/0120482 A1 | 5/2011 | Brenneise |
| 2011/0126847 A1 | 6/2011 | Zuber et al. |
| 2011/0126848 A1 | 6/2011 | Zuber et al. |
| 2011/0155153 A1 | 6/2011 | Thorens et al. |
| 2011/0155718 A1 | 6/2011 | Greim et al. |
| 2011/0162663 A1 | 7/2011 | Bryman |
| 2011/0168194 A1 | 7/2011 | Hon |
| 2011/0180082 A1 | 7/2011 | Banerjee et al. |
| 2011/0226236 A1 | 9/2011 | Buchberger |
| 2011/0265806 A1 | 11/2011 | Alarcon et al. |
| 2011/0290268 A1 | 12/2011 | Schennum |
| 2011/0309157 A1 | 12/2011 | Yang et al. |
| 2012/0042885 A1 | 2/2012 | Stone et al. |
| 2012/0048266 A1 | 3/2012 | Alelov |
| 2012/0060853 A1 | 3/2012 | Robinson et al. |
| 2012/0067357 A1 | 3/2012 | Boutros et al. |
| 2012/0111347 A1 | 5/2012 | Hon |
| 2012/0132643 A1 | 5/2012 | Choi et al. |
| 2012/0167906 A1 | 7/2012 | Gysland |
| 2012/0199572 A1 | 8/2012 | Shen et al. |
| 2012/0199663 A1 | 8/2012 | Qiu |
| 2012/0227753 A1 | 9/2012 | Newton |
| 2012/0231464 A1 | 9/2012 | Yu et al. |
| 2012/0260926 A1 | 10/2012 | Tu et al. |
| 2012/0279512 A1 | 11/2012 | Hon |
| 2012/0318882 A1 | 12/2012 | Abehasera |
| 2013/0042865 A1 | 2/2013 | Monsees et al. |
| 2013/0056888 A1 | 3/2013 | Holakovsky et al. |
| 2013/0081623 A1 | 4/2013 | Buchberger |
| 2013/0081642 A1 | 4/2013 | Safari |
| 2013/0104916 A1 | 5/2013 | Bellinger et al. |
| 2013/0192616 A1 | 8/2013 | Tucker et al. |
| 2013/0192622 A1 | 8/2013 | Tucker et al. |
| 2013/0199528 A1 | 8/2013 | Goodman et al. |
| 2013/0213419 A1 | 8/2013 | Tucker et al. |
| 2013/0220315 A1 | 8/2013 | Conley et al. |
| 2013/0228190 A1 | 9/2013 | Weiss et al. |
| 2013/0228191 A1 | 9/2013 | Newton |
| 2013/0233313 A1 | 9/2013 | Young et al. |
| 2013/0247924 A1 | 9/2013 | Scatterday et al. |
| 2013/0253427 A1 | 9/2013 | Cerman et al. |
| 2013/0284194 A1 | 10/2013 | Newton |
| 2013/0298905 A1 | 11/2013 | Levin et al. |
| 2013/0306064 A1 | 11/2013 | Thorens et al. |
| 2013/0306084 A1 | 11/2013 | Flick |
| 2013/0312742 A1 | 11/2013 | Monsees et al. |
| 2013/0312776 A1 | 11/2013 | Newton |
| 2013/0319435 A1 | 12/2013 | Flick |
| 2013/0319438 A1 | 12/2013 | Liu |
| 2013/0319440 A1 | 12/2013 | Capuano |
| 2013/0340775 A1 | 12/2013 | Juster et al. |
| 2014/0060552 A1 | 3/2014 | Cohen |
| 2014/0076310 A1 | 3/2014 | Newton |
| 2014/0238424 A1 | 8/2014 | Macko et al. |
| 2014/0345631 A1 | 11/2014 | Bowen et al. |
| 2014/0366898 A1 | 12/2014 | Monsees et al. |
| 2015/0020824 A1 | 1/2015 | Bowen et al. |
| 2015/0128971 A1 | 5/2015 | Verleur et al. |
| 2015/0208729 A1 | 7/2015 | Monsees et al. |

FOREIGN PATENT DOCUMENTS

| | | |
|---|---|---|
| CA | 2 752 255 | 8/2010 |
| CN | 1541577 | 11/2004 |
| CN | 2719043 | 8/2005 |
| CN | 200997909 | 1/2008 |
| CN | 101116542 | 2/2008 |
| CN | 101176805 | 5/2008 |
| CN | 201379072 | 1/2010 |
| DE | 10 2006 004 484 | 8/2007 |
| DE | 102006041042 | 3/2008 |
| DE | 20 2009 010 400 | 11/2009 |
| EP | 0 295 122 | 12/1988 |
| EP | 0 430 566 | 6/1991 |
| EP | 0 845 220 | 6/1998 |
| EP | 1 618 803 | 1/2006 |
| EP | 1989946 | 11/2008 |
| EP | 2 399 636 | 6/2010 |
| EP | 2 316 286 | 5/2011 |
| EP | 2 468 116 | 6/2012 |
| EP | 2 468 118 | 6/2012 |
| GB | 1444461 | 7/1976 |
| GB | 2469850 | 11/2010 |
| JP | 2005-198538 | 7/2005 |
| JP | 2007-207672 | 8/2007 |
| JP | 2007-222990 | 9/2007 |
| KR | 10 2005 0037919 | 4/2005 |
| KR | 100933516 | 12/2009 |
| KR | 200448259 | 3/2010 |
| KR | 20110001457 | 2/2011 |
| KR | 20110004049 | 4/2011 |
| RU | 115629 | 5/2012 |
| UA | 67598 | 6/2004 |
| WO | WO 1986/02528 | 5/1986 |
| WO | WO 1997/48293 | 12/1997 |
| WO | WO 02/37990 | 5/2002 |
| WO | WO 2004/043175 | 5/2004 |
| WO | WO 2007/131449 | 11/2007 |
| WO | WO 2009/105919 | 9/2009 |
| WO | WO 2009/155734 | 12/2009 |
| WO | WO 2010/003480 | 1/2010 |
| WO | WO 2010/045670 | 4/2010 |
| WO | WO 2010/073122 | 7/2010 |
| WO | WO 2010/091593 | 8/2010 |
| WO | WO 2010/118644 | 10/2010 |
| WO | WO 2010/140937 | 12/2010 |
| WO | WO 2011/010334 | 1/2011 |
| WO | WO 2011/081558 | 7/2011 |
| WO | WO 2011/109849 | 9/2011 |
| WO | WO 2012/072762 | 6/2012 |
| WO | WO 2012/085919 | 6/2012 |
| WO | WO 2012/100523 | 8/2012 |

(56) References Cited

FOREIGN PATENT DOCUMENTS

| WO | WO 2013/022936 | 2/2013 |
| WO | WO 2013/089551 | 6/2013 |

OTHER PUBLICATIONS

"(±)-1,2-propanediol," ChemSpider, [online], 2019, retrieved from the Internet, [retrieved Jan. 16, 2019], <URL: http://www.chemspider.com/Chemical-Structure.13835224.html?rid=ae1c106a-376d-4104-9a7c-f0910a5b5b20&page_num=0>. (Year: 2019).

E-Cigarette; May 2010; https://www.e-cigarette-forum.com/forum/threads/hi-how-does-one-use-madvapes-reward-points.130761/.

AEROSOL DELIVERY DEVICE

CROSS-REFERENCE TO RELATED APPLICATIONS

This application is a continuation of U.S. application Ser. No. 16/353,864, filed Mar. 14, 2019, which is a continuation of U.S. application Ser. No. 16/019,081, filed Jun. 26, 2018 (now U.S. Pat. No. 10,274,539), which is a continuation of U.S. application Ser. No. 13/788,455, filed Mar. 7, 2013 (now U.S. Pat. No. 10,031,183), each of these applications being hereby incorporated by reference in their entirety in this application.

FIELD OF THE INVENTION

The present invention relates to detecting a status of a cartridge in aerosol delivery articles used for yielding tobacco components or other materials in an inhalable form. Specifically, a detection system is capable of indicating whether a cartridge is used or unused.

BACKGROUND OF THE INVENTION

Many smoking devices have been proposed through the years as improvements upon, or alternatives to, smoking products that require combusting tobacco for use. Many of those devices purportedly have been designed to provide the sensations associated with cigarette, cigar, or pipe smoking, but without delivering considerable quantities of incomplete combustion and pyrolysis products that result from the burning of tobacco. To this end, there have been proposed numerous smoking products, flavor generators, and medicinal inhalers that utilize electrical energy to vaporize or heat a volatile material, or attempt to provide the sensations of cigarette, cigar, or pipe smoking without burning tobacco to a significant degree. See, for example, the various alternative smoking articles, aerosol delivery devices and heat generating sources set forth in the background art described in U.S. Pat. No. 7,726,320 to Robinson et al., U.S. patent application Ser. No. 13/432,406, filed Mar. 28, 2012, U.S. patent application Ser. No. 13/536,438, filed Jun. 28, 2012, U.S. patent application Ser. No. 13/602,871, filed Sep. 4, 2012, and U.S. patent application Ser. No. 13/647,000, filed Oct. 8, 2012, which are incorporated herein by reference.

Certain tobacco products that have employed electrical energy to produce heat for smoke or aerosol formation, and in particular, certain products that have been referred to as electronic cigarette products, have been commercially available throughout the world. Representative products that resemble many of the attributes of traditional types of cigarettes, cigars or pipes have been marketed as ACCORD® by Philip Morris Incorporated; ALPHA™, JOYE 510™ and M4™ by InnoVapor LLC; CIRRUS™ and FLING™ by White Cloud Cigarettes; COHITA™, COLIBRI™, ELITE CLASSIC™, MAGNUM™, PHANTOM™ and SENSE™ by Epuffer® International Inc.; DUOPRO™, STORM™ and VAPORKING® by Electronic Cigarettes, Inc.; EGAR™ by Egar Australia; eGo-C™ and eGo-T™ by Joyetech; ELUSION™ by Elusion UK Ltd; EONSMOKE® by Eonsmoke LLC; GREEN SMOKE® by Green Smoke Inc. USA; GREENARETTE™ by Greenarette LLC; HALLIGAN™, HENDU™ JET™, MAXXQ™ PINK™ and PITBULL™ by Smoke Stik®; HEATBAR™ by Philip Morris International, Inc.; HYDRO IMPERIAL™ and LXE™ from Crown7; LOGIC™ and THE CUBAN™ by LOGIC Technology; LUCI® by Luciano Smokes Inc.; METRO® by Nicotek, LLC; NJOY® and ONEJOY™ by Sottera, Inc.; NO. 7™ by SS Choice LLC; PREMIUM ELECTRONIC CIGARETTE™ by PremiumEstore LLC; RAPP E-MYSTICK™ by Ruyan America, Inc.; RED DRAGON™ by Red Dragon Products, LLC; RUYAN® by Ruyan Group (Holdings) Ltd.; SMART SMOKER® by The Smart Smoking Electronic Cigarette Company Ltd.; SMOKE ASSIST® by Coastline Products LLC; SMOKING EVERYWHERE® by Smoking Everywhere, Inc.; V2CIGS™ by VMR Products LLC; VAPOR NINE™ by VaporNine LLC; VAPOR4LIFE® by Vapor 4 Life, Inc.; VEPPO™ by E-CigaretteDirect, LLC and VUSE® by R. J. Reynolds Vapor Company. Yet other electrically powered aerosol delivery devices, and in particular those devices that have been characterized as so-called electronic cigarettes, have been marketed under the tradenames BLU™; COOLER VISIONS™; DIRECT E-CIG™; DRAGONFLY™; EMIST™; EVERSMOKE™; GAMUCCI®; HYBRID FLAME™; KNIGHT STICKS™; ROYAL BLUES™; SMOKETIP® and SOUTH BEACH SMOKE™.

It would be desirable to provide a smoking article that employs heat produced by electrical energy to provide the sensations of cigarette, cigar, or pipe smoking, that does so without combusting tobacco to any significant degree, that does so without the need of a combustion heat source, and that does so without necessarily delivering considerable quantities of incomplete combustion and pyrolysis products.

BRIEF SUMMARY OF THE DISCLOSURE

The above and other needs are met by the present disclosure which, in one aspect, provides a smoking article adapted to detect the status of a cartridge portion of the smoking article. The smoking article includes a control body portion having a control body engagement end, wherein the control body portion houses a control component and a power source therein. The article further comprises a cartridge body portion that includes a cartridge body engagement end configured to removably engage the control body engagement end of the control body portion. In various embodiments, cartridge body portion houses a consumable arrangement and a heating connection operably engaged therewith comprising at least one heating element and a fusible link.

In various embodiments of the smoking article of the present disclosure, the power source is selected from the group consisting of a battery, a capacitor, and combinations thereof. In specific embodiments of the article, the heating element is a resistance heating element. In specific embodiments of the article, the fusible link is an electrical fusible link. Alternatively, the fusible link can be a mechanical fusible link—i.e., can include a mechanical mechanism adapted for breaking the fusible link under certain predetermined conditions. In various embodiments of the smoking article, the heating element and the fusible link are electrically aligned in parallel arrangement. Furthermore, the fusible link can be adapted to fail under electrical conditions (e.g., an electrical current of defined voltage and duration) sufficient to cause heating of the heating element.

In various embodiments of the smoking article, the heating connection comprising a fusible link and a heating element is in electrical connection with the power source and the control component when the control body and the cartridge body are engaged with one another. The control component can comprise a microcontroller. Furthermore, the control component can be configured to selectively actuate a first electrical current flow of a first set of conditions from the power source to the heating connection when the control body and the cartridge body are engaged, wherein the conditions of the first electrical current flow are insufficient to initiate heating by the heating element. The first set of conditions can comprise a voltage that is substantially the same as a voltage that defines a working voltage for the heating element and a current flow duration of about 45 milliseconds or less (e.g., about 5 milliseconds to about 25 milliseconds). The working voltage can be about 2 volts to about 6 volts.

The control component can further be configured to selectively actuate a second electrical current flow of a second set of conditions from the power source to the heating connection, the conditions of said second electrical current flow being sufficient to initiate heating by the heating element. In various embodiments of the smoking article, the conditions of the second electrical current flow can be sufficient to cause the fusible link to fail. In some embodiments of the smoking article of the present disclosure, the conditions of the second electrical current flow can comprise a voltage that is greater than the nominal voltage of the first electrical current flow. In some embodiments, the conditions of the second electrical current flow can be approximately identical to the conditions of the first electrical current flow; however, the second electrical current flow can flow for a time duration that is sufficient to exceed a current flow time at which the fusible link is adapted to fail.

Various embodiments of the smoking article further comprise a current sense resistor, wherein the current sense resistor is adapted to establish an indication of the fusible link status. The control component can be further configured to initiate a command function based upon a cartridge status interpreted from the fusible link status indicated by the current sense resistor. Specifically, the current sense resistor can be adapted to sense a first resistance across the fusible link and a second resistance across the heating element. Sensing of the first resistance can be indicative of an unused cartridge. Sensing of the second resistance in the absence of the first resistance can be indicative of a used cartridge.

Various embodiments of the cartridge body further comprise a consumable arrangement in communication with the heating element. The consumable arrangement can comprise an aerosol precursor composition. In specific embodiments, the aerosol precursor composition is selected from the group consisting of a polyhydric alcohol, a medicament, a tobacco component, a tobacco-derived material, a flavorant, and combinations thereof. In specific embodiments, the polyhydric alcohol is selected from the group consisting of glycerin, propylene glycol, and combinations thereof. In various embodiments, the consumable arrangement comprises a substrate and an aerosol precursor composition, wherein the aerosol precursor composition is one of coated on, adsorbed by, and absorbed in at least a portion of the substrate.

The present disclosure also describes methods of detecting a status of a cartridge portion of a smoking article. Various embodiments of a cartridge status detection method comprise providing a control body comprising a control component and a power source, providing a cartridge body comprising a heating connection comprising a heating element and a fusible link, and removably engaging the cartridge body with the control body such that the heating connection is in electrical connection with the power source and the control component. The method further comprises establishment of a first electrical current flow from the power source to the heating connection and the control component, wherein the control component is configured to interpret the cartridge status based upon the first electrical current flowing through the heating connection. Similar aspects of the smoking article discussed above are provided in the cartridge status detection methods, as discussed in more detail below.

BRIEF DESCRIPTION OF THE FIGURES

Figure 1:
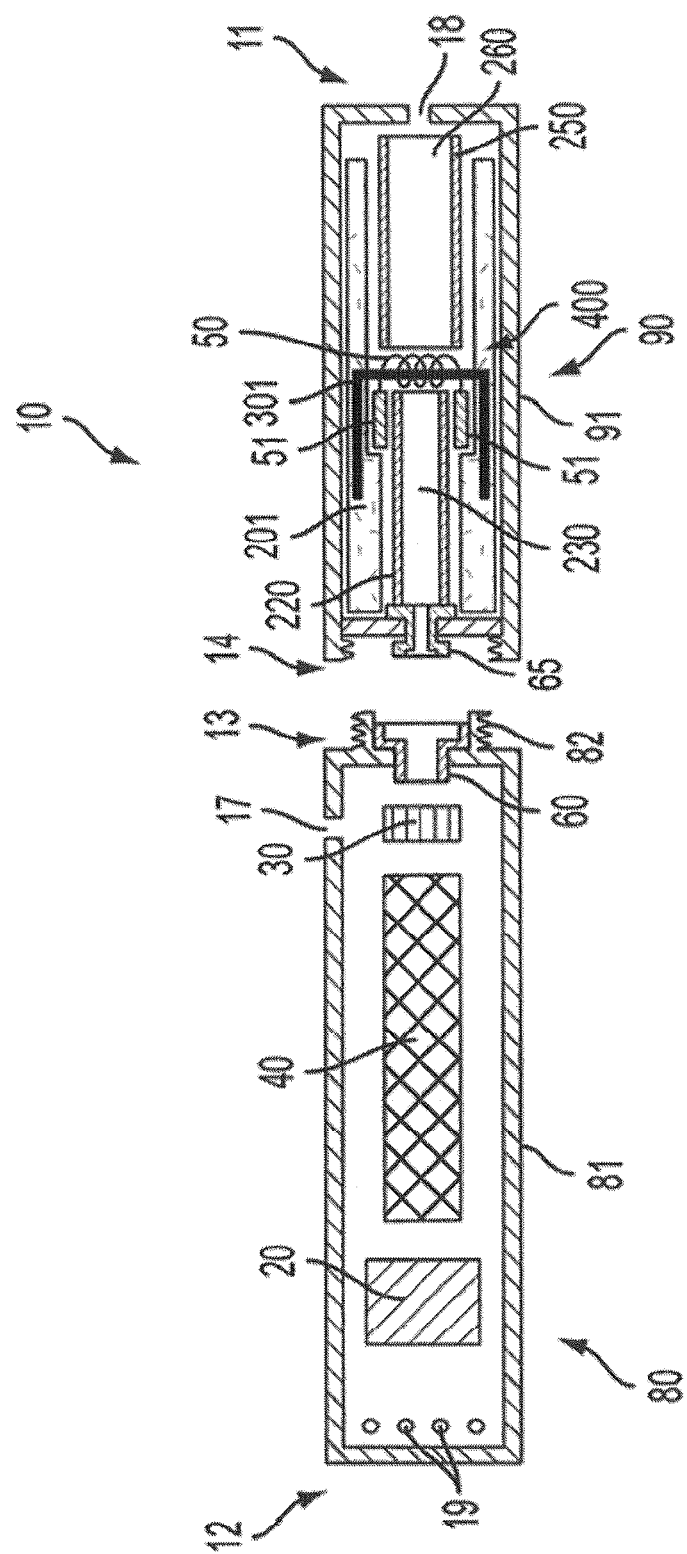
Figure 2:
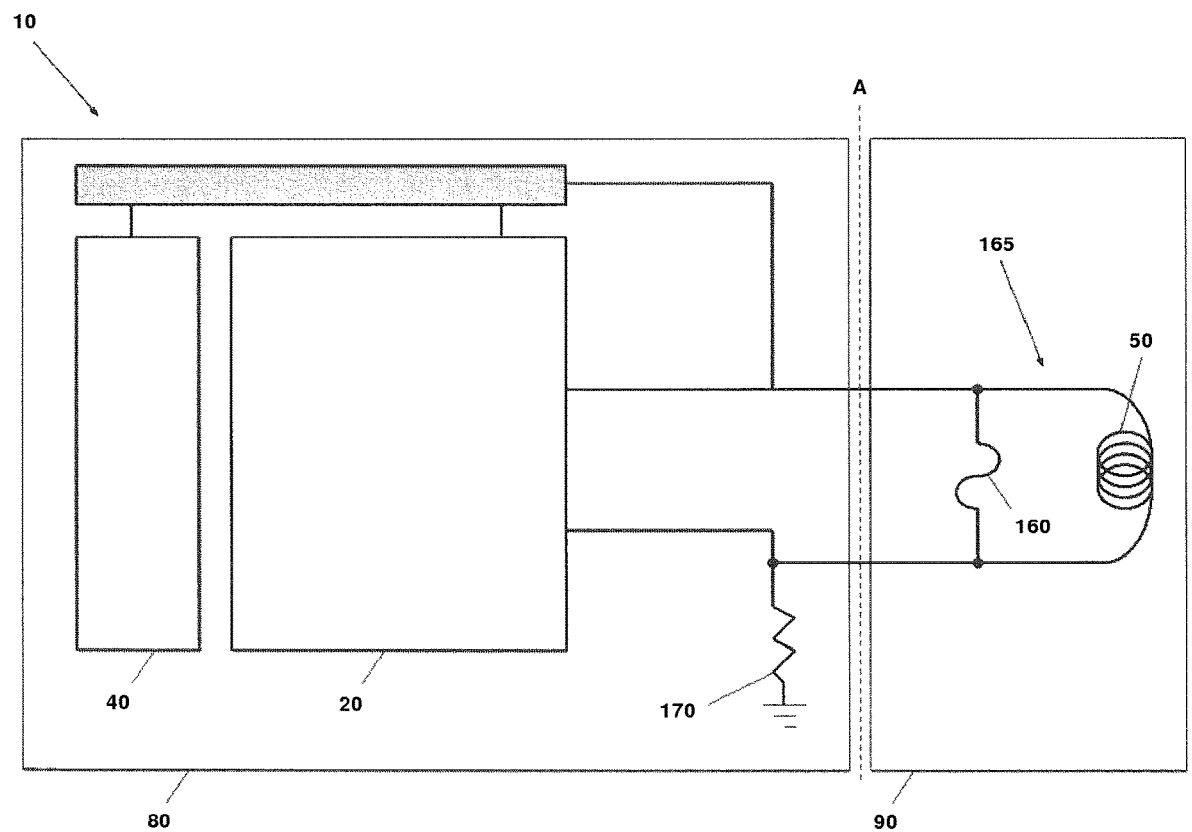
Figure 3:
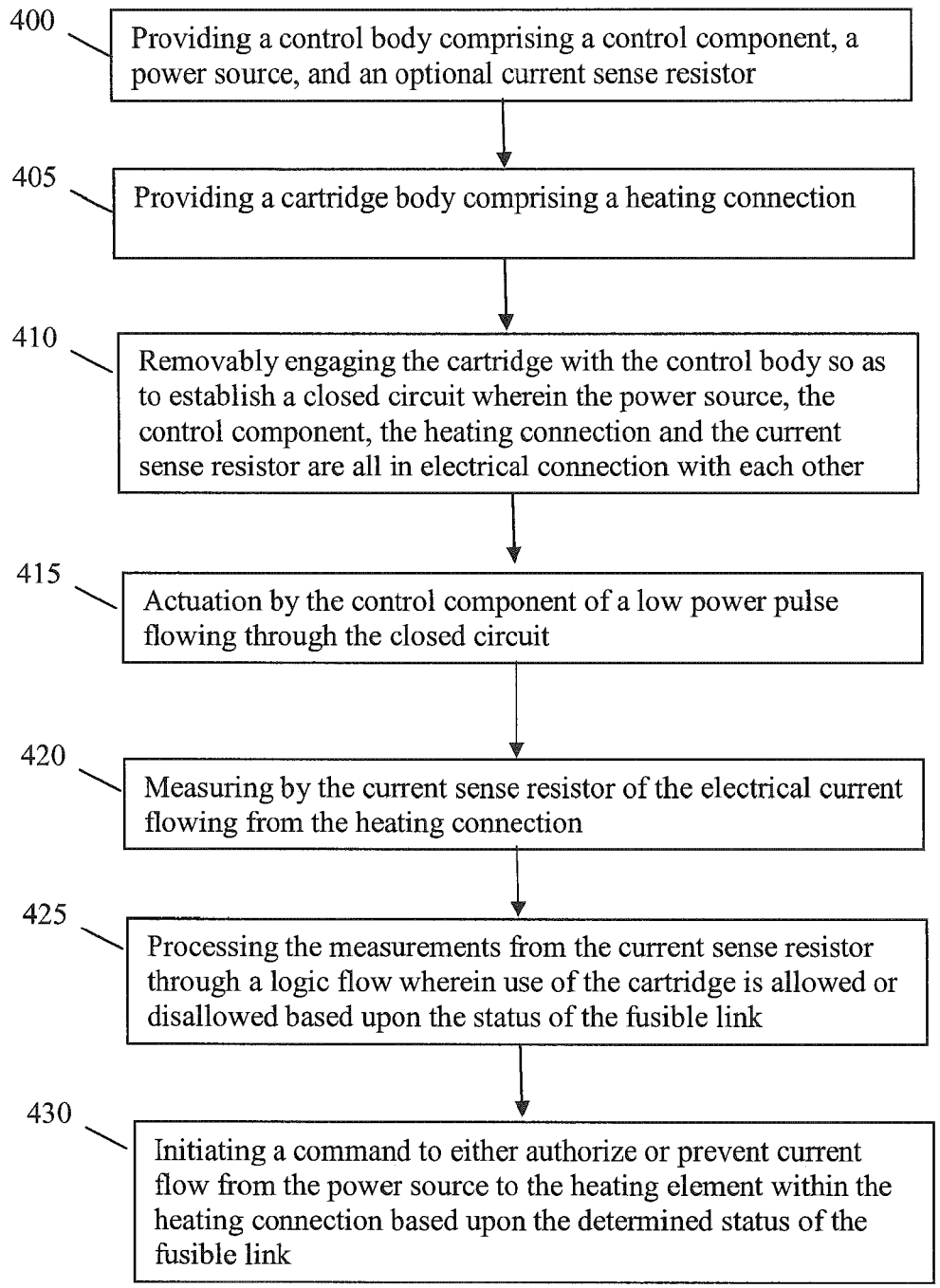
Figure 4:
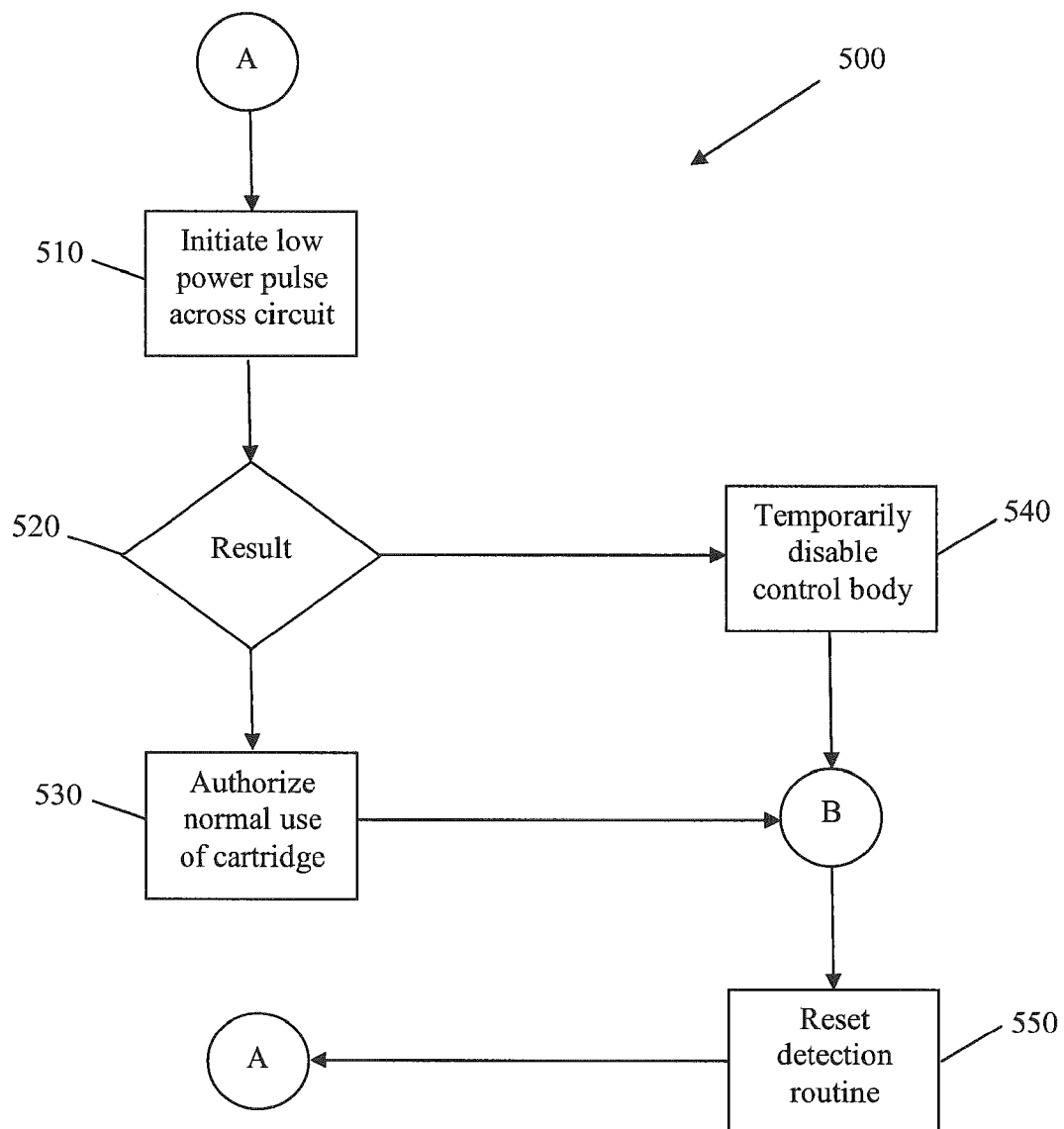

Having thus described the invention in the foregoing general terms, reference will now be made to the accompanying drawings, which are not necessarily drawn to scale, and wherein:

FIG. 1 is a perspective view of an example embodiment of a smoking article according to the disclosure, wherein a portion of an outer shell of the article is cut away to reveal the interior components thereof;

FIG. 2 is a block diagram of an example embodiment of a cartridge detection system according to the disclosure;

FIG. 3 is a flow diagram of an example embodiment of a method of detecting a status of a cartridge in a smoking article; and FIG. 4 is a logic flow chart that is exemplary of a decision pathway utilized by the control component to identify cartridge status in a smoking article.

DETAILED DESCRIPTION OF THE INVENTION

The present invention will now be described more fully hereinafter with reference to exemplary embodiments thereof. These exemplary embodiments are described so that this disclosure will be thorough and complete, and will fully convey the scope of the invention to those skilled in the art. Indeed, the invention may be embodied in many different forms and should not be construed as limited to the embodiments set forth herein; rather, these embodiments are provided so that this disclosure will satisfy applicable legal requirements. As used in the specification, and in the appended claims, the singular forms "a", "an", "the", include plural referents unless the context clearly dictates otherwise.

The present disclosure relates to articles (and the manufacture thereof) that use electrical energy to heat a material (preferably without combusting the material to any significant degree) to form an inhalable substance, the articles being sufficiently compact to be considered "hand-held" devices. In certain embodiments, the articles can particularly be characterized as smoking articles. As used herein, the term "smoking article" is intended to mean an article that provides many of the sensations (e.g., inhalation and exhalation rituals, types of tastes or flavors, organoleptic effects, physical feel, use rituals, visual cues such as those provided by visible aerosol, and the like) of smoking a cigarette, cigar, or pipe without any substantial degree of combustion of any component of the article. As used herein, the term "smoking article" does not necessarily mean that, in operation, the article produces smoke in the sense of the aerosol resulting from by-product of combustion or pyrolysis of tobacco, but rather, that the article yields vapors (including vapors within aerosols that can be considered to be visible aerosols that might be considered to be described as smoke-like) resulting from volitization or vaporization of certain components of the article or device." In highly preferred embodiments, articles characterized as smoking articles incorporate tobacco and/or components derived from tobacco.

In further embodiments, the articles that can be manufactured according to the present disclosure can be characterized as being vapor-producing articles, aerosolization articles, or medicament delivery articles. Thus, the articles can be arranged so as to provide one or more substances (e.g., flavors and/or pharmaceutical active ingredients) in an inhalable form or state. For example, inhalable substances can be substantially in the form of a vapor (i.e., a substance that is in the gas phase at a temperature lower than its critical point). Alternatively, inhalable substances can be in the form of an aerosol (i.e., a suspension of fine solid particles or liquid droplets in a gas). For purposes of simplicity, the term "aerosol" as used herein is meant to include vapors, gases and aerosols of a form or type suitable for human inhalation, whether or not visible, and whether or not of a form that might be considered to be smoke-like.

In use, smoking articles that can be manufactured according to the present disclosure may be subjected to many of the physical actions of an individual in using a traditional type of smoking article (e.g., a cigarette, cigar or pipe that is employed by lighting with a flame and used by inhaling tobacco that is subsequently burned). For example, the user of a smoking article of the present invention can hold that article much like a traditional type of smoking article, draw on one end of that article for inhalation of aerosol produced by that article, take puffs at selected intervals of time.

A smoking article that can be manufactured according to one aspect of the present disclosure can include a number of components provided within an outer shell or body. The overall design of the outer shell or body can vary, and the format or configuration of the outer body that can define the overall size and shape of the smoking article can vary. Typically, an elongated body resembling shape of a cigarette or cigar can be a formed from a single, unitary shell; or the elongated body can be formed of two or more separable pieces. For example, a smoking article can comprise an elongated shell or body that can be substantially tubular in shape, and as such, resemble the shape of a conventional cigarette or cigar. In one embodiment, all of the components of the smoking article are contained within one outer body or shell. Alternatively, a smoking article can comprise two shells that are joined and are separable. For example, a smoking article can possess at one end a control body comprising a shell containing one or more reusable components (e.g., a rechargeable battery and various electronics for controlling the operation of that article), and at the other end and removably attached thereto a shell containing a disposable portion (e.g., a disposable flavor-containing cartridge). Additionally, various smoking article designs and component arrangements can be appreciated upon consideration of the commercially available electronic smoking articles, such as those representative products listed in the background art section of the present disclosure.

A smoking article that can be manufactured according to one aspect of the present disclosure can include some combination of power source (i.e., an electrical power source), at least one control component (e.g., means for actuating, controlling, regulating and ceasing power for heat generation, such as by controlling electrical current flow the power source to other components of the article), a heater or heat generation component (e.g., an electrical resistance heating element or component commonly referred to as an "atomizer"), and an aerosol precursor component (e.g., commonly a liquid capable of yielding an aerosol upon application of sufficient heat, such as ingredients commonly referred to as "smoke juice," "e-liquid" and "e-juice"), and a mouthend region or tip for allowing draw upon the smoking article for aerosol inhalation (e.g., a defined air flow path through the article such that aerosol generated can be withdrawn therefrom upon draw). Alignment of the components within the article can vary. In specific embodiments, the aerosol precursor component can be located near an end of the article (e.g., with a cartridge, which in certain circumstances can be replaceable and disposable) that is proximal to the mouth of a user so as to maximize aerosol delivery to the user. Other configurations, however, are not excluded. Generally, the heater component can be positioned sufficiently near that aerosol precursor component so that heat from the heater component can volatilize the aerosol precursor (as well as one or more flavorants, medicaments, or the like that may likewise be provided for delivery to a user) and form an aerosol for delivery to the user. When the heating member heats the aerosol precursor component, an aerosol is formed, released, or generated in a physical form suitable for inhalation by a consumer. It should be noted that the foregoing terms are meant to be interchangeable such that reference to release, releasing, releases, or released includes form or generate, forming or generating, forms or generates, and formed or generated. Specifically, an inhalable substance is released in the form of a vapor or aerosol or mixture thereof. Additionally, the selection of various smoking article components can be appreciated upon consideration of the commercially available electronic smoking articles, such as those representative products listed in the background art section of the present disclosure.

A smoking article that can be manufactured according to one aspect of the present disclosure can include may incorporate a battery or other electrical power source to provide current flow sufficient to provide various functionalities to the article, such as resistive heating, powering of control systems, powering of indicators, and the like. The power source can take on various embodiments. Preferably, the power source is able to deliver sufficient power to rapidly heat the heating member to provide for aerosol formation and power the article through use for the desired duration of time. The power source preferably is sized to fit conveniently within the article so that the article can be easily handled; and additionally, preferred a preferred power source is of a sufficiently light weight to not detract from a desirable smoking experience.

An exemplary smoking article 10 according to the disclosure is shown in FIG. 1. As seen in the surface illustrated therein, the smoking article 10 can comprise a control body 80 and a cartridge 90 that can be aligned in a functioning relationship. In this regard, the control body 80 and the cartridge 90 may be attachable and detachable from each other. Although a threaded engagement is illustrated in FIG. 1, it is understood that further means of engagement are encompassed, such as a press-fit engagement, a magnetic engagement, or the like. The cartridge can particularly include a single use connector as otherwise described herein.

In specific embodiments, the control body 80 may be referred to as being reusable and the cartridge 90 may be referred to as being disposable. In some embodiments, the entire smoking article may be characterized as being disposable in that the control body may be configured for only a limited number of uses (e.g., until a battery power component no longer provides sufficient power to the smoking article) with a limited number of cartridges and, thereafter, the entire smoking article 10, including the control body, may be discarded. In other embodiments, the control body may have a replaceable battery such that the control body can be reused through a number of battery exchanges and with many cartridges. Similarly, the smoking article 10 may be rechargeable and thus may be combined with any type of recharging technology, including connection to a typical electrical outlet, connection to a car charger (i.e., cigarette lighter receptacle), and connection to a computer, such as through a USB cable.

The control body 80 includes a control component 20, a flow sensor 30, and a battery 40. Although these components are illustrated in a specific alignment, it is understood that various alignments of the components are encompassed by the present disclosure. The control body 80 further includes a plurality of indicators 19 at a distal end 12 of the control body shell 81. Such indicators 19 can show the number of puffs taken or remaining from the smoking article can be indicative of an active or inactive status, can light up in response to a puff, or the like. The indicators can be provided in varying numbers and can take on different shapes and can even be simply an opening in the body (such as for release of sound when such indicators are present).

Various positions for one or more air intakes 17 are encompassed by the present disclosure. As shown, the air intake 17 may be positioned in the control body shell 81 such that air drawn through the intake sufficiently contacts the flow sensor 30 to activate the sensor (although other positions are encompassed, particularly if different sensing means are provided or if manual actuation, such as with a push button, is provided). A receptacle 60 also is included at the proximal attachment end 13 of the control body 80 and extends into the control body projection 82 to allow for ease of electrical connection with the resistive heating element 50 when the cartridge 90 is attached to the control body. In the illustrated embodiment, the receptacle 60 includes a central open passage to facilitate air flow from the air intake in the control body into the cartridge during use of the article 10.

The cartridge 90 includes a cartridge shell 91 with a mouth opening 18 at the mouthend 11 thereof to allow passage of air and entrained vapor (i.e., the components of the aerosol precursor composition in an inhalable form) from the cartridge to a consumer during draw on the smoking article 10. The smoking article 10 according to the present disclosure may have an overall shape that may be defined as being substantially rod-like or substantially tubular shaped or substantially cylindrically shaped. As illustrated in FIG. 1, the smoking article 10 has a substantially round cross-section; however, other cross-sectional shapes (e.g., oval, square, triangle, etc.) also are encompassed by the present disclosure. Such language that is descriptive of the physical shape of the smoking article may also be applied to the individual units of the smoking article in embodiments comprising multiple units, such as a control body and a cartridge.

In preferred embodiments, the smoking article 10 may take on a size that is comparative to a cigarette or cigar shape. Thus, the smoking article may have a diameter of about 5 mm to about 25 mm, about 5 mm to about 20 mm, about 6 mm to about 15 mm, or about 6 mm to about 10 mm. Such dimension may particularly correspond to the outer diameter of the control body shell 81 and/or the cartridge shell 91. The control body can have a length of about 50 mm to about 110 mm, about 60 mm to about 100 mm, or about 65 mm to about 95 mm. The cartridge can have a length of about 20 mm to about 60 mm, about 25 mm to about 55 mm, or about 30 mm to about 50 mm. The overall length of the combined cartridge and control body (or the overall length of a smoking article according to the disclosure formed of a single, unitary shell) can be approximately equal to or less than the length of a typical cigarette—e.g., about 70 mm to about 130 mm, about 80 mm to about 125 mm, or about 90 mm to about 120 mm.

The cartridge shell 91 of the smoking article 10 can be formed of any material suitable for forming and maintaining an appropriate conformation, such as a tubular shape, and for retaining therein the suitable components of the smoking article. The body can be formed of a single wall, as shown in FIG. 1. The cartridge shell 91 can be formed of a material (natural or synthetic) that is heat resistant so as to retain its structural integrity—e.g., does not degrade—at least at a temperature that is the heating temperature provided by the resistive heating element. In some embodiments, a heat resistant polymer may be used. In other embodiments, the body can be formed from paper, such as a paper that is substantially straw-shaped, or from metal, such as stainless steel. As further discussed herein, the body, such as a paper tube, may have one or more layers associated therewith that function to substantially prevent movement of vapor therethrough. In one example, an aluminum foil layer may be laminated to one surface of the body. Ceramic materials also may be used.

The cartridge 90 further includes a resistive heating element 50 in the form of a metal wire coil. The resistive heating element includes terminals 51 (e.g., positive and negative terminals) at the opposing ends thereof for facilitating current flow through the resistive heating element and for attachment of the appropriate wiring (not illustrated) to form an electrical connection of the resistive heating element with the battery 40 when the cartridge 90 is connected to the control body 80. Specifically, a plug 65 is positioned at the distal attachment end 14 of the cartridge. When the cartridge 90 is connected to the control body 80, the plug 65 engages the receptacle 60 to form an electrical connection such that current controllably flows from the battery 40, through the receptacle and plug, and to the resistive heating element 50. The cartridge shell 91 can continue across the distal attachment end such that this end of the cartridge is substantially closed with the plug protruding therefrom. As illustrated in FIG. 1, the plug 65 includes an open central passage that aligns with the open central passage in the receptacle 60 to allow air to flow from the control body 80 and into the cartridge 90.

Generally, in use, when a consumer draws on the mouthend 11 of the cartridge, the flow sensor 30 detects the change in flow and activates the control component 20 to facilitate current flow through the resistive heating element 50. Thus, it is useful for air flow to travel through the control body 80 in a manner that flow sensor 30 detects air flow almost instantaneously.

The control algorithm may call for power to the resistive heating element 50 to cycle and thus maintain a defined temperature. The control algorithm therefore can be programmed to automatically deactivate the smoking article 10 and discontinue power flow through the smoking article after a defined time lapse without a puff by a consumer. Moreover, the smoking article can include a temperature sensor to provide feedback to the control component. Such sensor can be, for example, in direct contact with the resistive heating element 50. Alternative temperature sensing means likewise may be used, such as relying upon logic control components to evaluate resistance through the resistive heating element and correlate such resistance to the temperature of the element. In other embodiments, the flow sensor 30 may be replaced by appropriate components to provide alternative sensing means, such as capacitive sensing. Still further, one or more control buttons can be included to allow for manual actuation by a consumer to elicit a variety of functions, such as powering the article 10 on and off, turning on the heating element 50 to generate a vapor or aerosol for inhalation, or the like.

When the flow sensor 30 is positioned within the control body 80, it can be useful to have an air intake 17 on the control body. If desired, a sealed flow path can be provided such that the flow sensor 30 within the control body 80 is in fluid connection with the cartridge interior after the cartridge and the control body are engaged, such fluid connection being sealed with respect to the remainder of the components within the control body but opening into the cartridge 90 when attached to the control body. Further, in other embodiments, the flow sensor 30 can be located within the cartridge 90 instead of the control body 80.

A reservoir may utilize a transport element to transport an aerosol precursor composition to an aerosolization zone. As used herein, the term "reservoir" refers to a receptacle or chamber for holding, storing, or retaining a product such as a liquid, fluid, or aerosol. One such example is shown in FIG. 1. As seen therein, the cartridge 90 includes a reservoir layer 201 comprising layers of nonwoven fibers formed into the shape of a tube encircling the interior of the cartridge shell 91, in this embodiment. An aerosol precursor composition is retained in the reservoir layer 201. Liquid components, for example, can be sorptively retained by the reservoir layer 201. The reservoir layer 201 is in fluid connection with a transport element 301 (a wick in this embodiment). The transport element 301 transports the aerosol precursor composition stored in the reservoir layer 201 via capillary action to an aerosolization zone 400 of the cartridge 90. As illustrated, the transport element 301 is in direct contact with the resistive heating element 50 that is in the form of a metal wire coil in this embodiment.

In use, when a user draws on the article 10, the resistive heating element 50 is activated (e.g., such as via a puff sensor), and the components for the aerosol precursor composition are vaporized in the aerosolization zone 400. Drawing upon the mouthend 11 of the article 10 causes ambient air to enter the air intake 17 and pass through the central opening in the receptacle 60 and the central opening in the plug 65. In the cartridge 90, the drawn air passes through an air passage 230 in an air passage tube 220 and combines with the formed vapor in the aerosolization zone 400 to form an aerosol. The aerosol is whisked away from the aerosolization zone, passes through an air passage 260 in an air passage tube 250, and out the mouth opening 18 in the mouthend 11 of the article 10. If desired, the air passage tube 250 can be absent, and an open cavity may reside in the location for formation of aerosol as the aerosol precursor composition is vaporized by the resistive heating element 50.

The smoking article 10 in the embodiment illustrated in FIG. 1 can be characterized as a disposable article. Accordingly, it can be desirable for the reservoir 201 in such embodiments to include a sufficient amount of aerosol precursor composition and any further inhalable materials so that a consumer can obtain more than a single use of the smoking article. For example, the smoking article can include sufficient aerosolizable and/or inhalable materials such that the smoking article can provide a number of puffs substantially equivalent to the number of puffs (of about two seconds duration) available from a plurality of conventional cigarettes—e.g., 2 or more, 5 or more, 10 or more, or 20 or more conventional cigarettes. More particularly, a disposable, single unit article according to the embodiment of FIG. 1 can provide about 20 or more, about 50 or more, or about 100 or more puffs.

Although FIG. 1 is illustrative of a smoking article according to the present disclosure, the scope of the disclosure should not be viewed as being limited to the specific combination and/or arrangement of components illustrated therein. Rather, the present disclosure can encompass a variety of combinations of components useful in forming an electronic smoking article. Reference is made for example to the smoking articles disclosed in U.S. patent application Ser. No. 13/536,438, filed Jun. 28, 2012, and U.S. patent application Ser. No. 13/432,406, filed Mar. 28, 2012, the disclosures of which are incorporated herein by reference in their entirety. Further to the above, representative heating element and materials for use therein are described in U.S. Pat. No. 5,060,671 to Counts et al.; U.S. Pat. No. 5,093,894 to Deevi et al.; U.S. Pat. No. 5,224,498 to Deevi et al.; U.S. Pat. No. 5,228,460 to Sprinkel Jr., et al.; U.S. Pat. No. 5,322,075 to Deevi et al.; U.S. Pat. No. 5,353,813 to Deevi et al.; U.S. Pat. No. 5,468,936 to Deevi et al.; U.S. Pat. No. 5,498,850 to Das; U.S. Pat. No. 5,659,656 to Das; U.S. Pat. No. 5,498,855 to Deevi et al.; U.S. Pat. No. 5,530,225 to Hajaligol; U.S. Pat. No. 5,665,262 to Hajaligol; U.S. Pat. No. 5,573,692 to Das et al.; and U.S. Pat. No. 5,591,368 to Fleischhauer et al., the disclosures of which are incorporated herein by reference in their entireties.

The various components of a smoking article according to the present invention can be chosen from components described in the art and commercially available. Examples of batteries that can be used according to the disclosure are described in US Pub. App. No. 2010/0028766, the disclosure of which is incorporated herein by reference in its entirety.

An exemplary mechanism that can provide puff-actuation capability includes a Model 163PC01D36 silicon sensor, manufactured by the MicroSwitch division of Honeywell, Inc., Freeport, Ill. Further examples of demand-operated electrical switches that may be employed in a heating circuit according to the present disclosure are described in U.S. Pat. No. 4,735,217 to Gerth et al., which is incorporated herein by reference in its entirety. Further description of current regulating circuits and other control components, including microcontrollers, that can be useful in the present smoking article are provided in U.S. Pat. Nos. 4,922,901, 4,947,874, and 4,947,875, all to Brooks et al., U.S. Pat. No. 5,372,148 to McCafferty et al., U.S. Pat. No. 6,040,560 to Fleischhauer et al., and U.S. Pat. No. 7,040,314 to Nguyen et al., all of which are incorporated herein by reference in their entireties.

The aerosol precursor, which may also be referred to as a vapor precursor composition, can comprise one or more different components. For example, the aerosol precursor can include a polyhydric alcohol (e.g., glycerin, propylene glycol, or a mixture thereof). Representative types of further aerosol precursor compositions are set forth in U.S. Pat. No. 4,793,365 to Sensabaugh, Jr. et al.; U.S. Pat. No. 5,101,839 to Jakob et al.; PCT WO 98/57556 to Biggs et al.; and Chemical and Biological Studies on New Cigarette Prototypes that Heat Instead of Burn Tobacco, R. J. Reynolds Tobacco Company Monograph (1988); the disclosures of which are incorporated herein by reference.

Aerosol precursor compositions can include further liquid materials, such as water. For example, aerosol precursor compositions can incorporate mixtures of glycerin and water, or mixtures of propylene glycol and water, or mixtures of propylene glycol and glycerin, or mixtures of propylene glycol, glycerin, and water. Exemplary aerosol precursor compositions also include those types of materials incorporated within devices available through Atlanta Imports Inc., Acworth, Ga., USA, as an electronic cigar having the brand name E-CIG, which can be employed using associated Smoking Cartridges Type C1a, C2a, C3a, C4a, C1b, C2b, C3b and C4b; and as Ruyan Atomizing Electronic Pipe and Ruyan Atomizing Electronic Cigarette from Ruyan SBT Technology and Development Co., Ltd., Beijing, China.

The aerosol precursor composition used in the disclosed smoking article further can comprise one or more flavors, medicaments, or other inhalable materials. For example, liquid nicotine can be used. Such further materials can comprise one or more components of the aerosol precursor or vapor precursor composition. Thus, the aerosol precursor or vapor precursor composition can be described as comprising an inhalable substance. Such inhalable substance can include flavors, medicaments, and other materials as discussed herein. Particularly, an inhalable substance delivered using a smoking article according to the present invention can comprise a tobacco component or a tobacco-derived material. Alternately, the flavor, medicament, or other inhalable material can be provided separate from other aerosol precursor components—e.g., in a reservoir. As such, defined aliquots of the flavor, medicament, or other inhalable material may be separately or simultaneously delivered to the resistive heating element to release the flavor, medicament, or other inhalable material into an air stream to be inhaled by a user along with the further components of the aerosol precursor or vapor precursor composition.

A wide variety of types of flavoring agents, or materials that alter the sensory or organoleptic character or nature of the mainstream aerosol of the smoking article can be employed. Such flavoring agents can be provided from sources other than tobacco, can be natural or artificial in nature, and can be employed as concentrates or flavor packages. Of particular interest are flavoring agents that are applied to, or incorporated within, those regions of the smoking article where aerosol is generated. Again, such agents can be supplied directly to the resistive heating element or may be provided on a substrate as already noted above. Exemplary flavoring agents include vanillin, ethyl vanillin, cream, tea, coffee, fruit (e.g., apple, cherry, strawberry, peach and citrus flavors, including lime and lemon), maple, menthol, mint, peppermint, spearmint, wintergreen, nutmeg, clove, lavender, cardamom, ginger, honey, anise, sage, cinnamon, sandalwood, jasmine, cascarilla, cocoa, licorice, and flavorings and flavor packages of the type and character traditionally used for the flavoring of cigarette, cigar, and pipe tobaccos. Syrups, such as high fructose corn syrup, also can be employed. Flavoring agents also can include acidic or basic characteristics (e.g., organic acids, such as levulinic acid, succinic acid, lactic acid, and pyruvic acid). The flavoring agents can be combined with the aerosol-generating material if desired. Exemplary plant-derived compositions that may be used are disclosed in U.S. application Ser. No. 12/971,746 to Dube et al. and U.S. application Ser. No. 13/015,744 to Dube et al., the disclosures of which are incorporated herein by reference in their entireties.

Organic acids particularly may be incorporated into the aerosol precursor to provide desirable alterations to the flavor, sensation, or organoleptic properties of medicaments, such as nicotine, that may be combined with the aerosol precursor. For example, organic acids, such as levulinic acid, succinic acid, lactic acid, and pyruvic acid, may be included in the aerosol precursor with nicotine in amounts up to being equimolar (based on total organic acid content) with the nicotine. Any combination of organic acids can be used. For example, the aerosol precursor can include about 0.1 to about 0.5 moles of levulinic acid per one mole of nicotine, about 0.1 to about 0.5 moles of pyruvic acid per one mole of nicotine, about 0.1 to about 0.5 moles of lactic acid per one mole of nicotine, or combinations thereof, up to a concentration wherein the total amount of organic acid present is equimolar to the total amount of nicotine present in the aerosol precursor.

In embodiments of the aerosol precursor material that contain a tobacco extract, including pharmaceutical grade nicotine derived from tobacco, it is advantageous for the tobacco extract to be characterized as substantially free of compounds collectively known as Hoffmann analytes, including, for example, tobacco-specific nitrosamines (TS-NAs), including N'-nitrosonomicotine (NNN), (4-methylnitrosamino)-1-(3-pyridyl)-1-butanone (NNK), N'-nitrosoanatabine (NAT), and N'-nitrosoanabasine (NAB); polyaromatic hydrocarbons (PAHs), including benz[a]anthracene, benzo[a]pyrene, benzo[b]fluoranthene, benzo[k]fluoranthene, chrysene, dibenz[a,h]anthracene, and indeno [1,2,3-cd]pyrene, and the like. In certain embodiments, the aerosol precursor material can be characterized as completely free of any Hoffmann analytes, including TSNAs and PAHs. Embodiments of the aerosol precursor material may have TSNA levels (or other Hoffmann analyte levels) in the range of less than about 5 ppm, less than about 3 ppm, less than about 1 ppm, or less than about 0.1 ppm, or even below any detectable limit. Certain extraction processes or treatment processes can be used to achieve reductions in Hoffmann analyte concentration. For example, a tobacco extract can be brought into contact with an imprinted polymer or non-imprinted polymer such as described, for example, in US Pat. Pub. Nos. 2007/0186940 to Bhattacharyya et al; 2011/0041859 to Rees et al.; 2011/0159160 to Jonsson et al; and 2012/0291793 to Byrd et al., all of which are incorporated herein by reference. Further, the tobacco extract could be treated with ion exchange materials having amine functionality, which can remove certain aldehydes and other compounds. See, for example, U.S. Pat. No. 4,033,361 to Horsewell et al. and U.S. Pat. No. 6,779,529 to Figlar et al., which are incorporated herein by reference in their entireties.

In certain embodiments, the aerosol precursor can be adapted to increase in surface area during heating for aerosol formation in an electronic smoking article. In particular, the aerosol precursor can comprise an effervescent material. The effervescent material can be adapted to degrade during heating and release carbon dioxide (or other gaseous substance) sufficient to cause foaming of at least a portion of the aerosol precursor or to produce fine droplets. Inclusion of such effervescent can be beneficial to reduce the amount of heat needed to form an aerosol from the aerosol precursor.

The aerosol precursor composition may take on a variety of conformations based upon the various amounts of materials utilized therein. For example, a useful aerosol precursor composition may comprise up to about 98% by weight up to about 95% by weight, or up to about 90% by weight of a polyol. This total amount can be split in any combination between two or more different polyols. For example, one polyol can comprise about 50% to about 90%, about 60% to about 90%, or about 75% to about 90% by weight of the aerosol precursor, and a second polyol can comprise about 2% to about 45%, about 2% to about 25%, or about 2% to about 10% by weight of the aerosol precursor. A useful aerosol precursor also can comprise up to about 25% by weight, about 20% by weight or about 15% by weight water—particularly about 2% to about 25%, about 5% to about 20%, or about 7% to about 15% by weight water.

Flavors and the like (which can include medicaments, such as nicotine) can comprise up to about 10%, up to about 8%, or up to about 5% by weight of the aerosol precursor.

As a non-limiting example, an aerosol precursor according to the invention can comprise glycerol, propylene glycol, water, nicotine, and one or more flavors. Specifically, the glycerol can be present in an amount of about 70% to about 90% by weight, about 70% to about 85% by weight, or about 75% to about 85% by weight, the propylene glycol can be present in an amount of about 1% to about 10% by weight, about 1% to about 8% by weight, or about 2% to about 6% by weight, the water can be present in an amount of about 10% to about 20% by weight, about 10% to about 18% by weight, or about 12% to about 16% by weight, the nicotine can be present in an amount of about 0.1% to about 5% by weight, about 0.5% to about 4% by weight, or about 1% to about 3% by weight, and the flavors can be present in an amount of up to about 5% by weight, up to about 3% by weight, or up to about 1% by weight, all amounts being based on the total weight of the aerosol precursor. One specific, non-limiting example of an aerosol precursor comprises about 75% to about 80% by weight glycerol, about 13% to about 15% by weight water, about 4% to about 6% by weight propylene glycol, about 2% to about 3% by weight nicotine, and about 0.1% to about 0.5% by weight flavors. The nicotine, for example, can be a from a tobacco extract.

The amount of aerosol precursor composition that is used within the smoking article is such that the article exhibits acceptable sensory and organoleptic properties, and desirable performance characteristics. For example, it is highly preferred that sufficient aerosol precursor composition components, such as glycerin and/or propylene glycol, be employed in order to provide for the generation of a visible mainstream aerosol that in many regards resembles the appearance of tobacco smoke. Typically, the amount of aerosol-generating material incorporated into the smoking article is in the range of about 1.5 g or less, about 1 g or less, or about 0.5 g or less. The amount of aerosol precursor composition can be dependent upon factors such as the number of puffs desired per cartridge used with the smoking article. It is desirable for the aerosol precursor composition not to introduce significant degrees of unacceptable off-taste, filmy mouth-feel, or an overall sensory experience that is significantly different from that of a traditional type of cigarette that generates mainstream smoke by burning tobacco cut filler. The selection of the particular aerosol-generating material and reservoir material, the amounts of those components used, and the types of tobacco material used, can be altered in order to control the overall chemical composition of the mainstream aerosol produced by the smoking article.

Still further components can be utilized in the smoking article of the present disclosure. For example, U.S. Pat. No. 5,261,424 to Sprinkel, Jr. discloses piezoelectric sensors that can be associated with the mouth-end of a device to detect user lip activity associated with taking a draw and then trigger heating; U.S. Pat. No. 5,372,148 to McCafferty et al. discloses a puff sensor for controlling energy flow into a heating load array in response to pressure drop through a mouthpiece; U.S. Pat. No. 5,967,148 to Harris et al. discloses receptacles in a smoking device that include an identifier that detects a non-uniformity in infrared transmissivity of an inserted component and a controller that executes a detection routine as the component is inserted into the receptacle; U.S. Pat. No. 6,040,560 to Fleischhauer et al. describes a defined executable power cycle with multiple differential phases; U.S. Pat. No. 5,934,289 to Watkins et al. discloses photonic-optronic components; U.S. Pat. No. 5,954,979 to Counts et al. discloses means for altering draw resistance through a smoking device; U.S. Pat. No. 6,803,545 to Blake et al. discloses specific battery configurations for use in smoking devices; U.S. Pat. No. 7,293,565 to Griffen et al. discloses various charging systems for use with smoking devices; US 2009/0320863 by Fernando et al. discloses computer interfacing means for smoking devices to facilitate charging and allow computer control of the device; US 2010/0163063 by Fernando et al. discloses identification systems for smoking devices; and WO 2010/003480 by Flick discloses a fluid flow sensing system indicative of a puff in an aerosol generating system; all of the foregoing disclosures being incorporated herein by reference in their entireties. Further examples of components related to electronic aerosol delivery articles and disclosing materials or components that may be used in the present article include U.S. Pat. No. 4,735,217 to Gerth et al.; U.S. Pat. No. 5,249,586 to Morgan et al.; U.S. Pat. No. 5,666,977 to Higgins et al.; U.S. Pat. No. 6,053,176 to Adams et al.; U.S. Pat. No. 6,164,287 to White; U.S. Pat. No. 6,196,218 to Voges; U.S. Pat. No. 6,810,883 to Felter et al.; U.S. Pat. No. 6,854,461 to Nichols; U.S. Pat. No. 7,832,410 to Hon; U.S. Pat. No. 7,513,253 to Kobayashi; U.S. Pat. No. 7,896,006 to Hamano; U.S. Pat. No. 6,772,756 to Shayan; US Pat. Pub. Nos. 2009/0095311, 2006/0196518, 2009/0126745, and 2009/0188490 to Hon; US Pat. Pub. No. 2009/0272379 to Thorens et al.; US Pat. Pub. Nos. 2009/0260641 and 2009/0260642 to Monsees et al.; US Pat. Pub. Nos. 2008/0149118 and 2010/0024834 to Oglesby et al.; US Pat. Pub. No. 2010/0307518 to Wang; and WO 2010/091593 to Hon. A variety of the materials disclosed by the foregoing documents may be incorporated into the present devices in various embodiments, and all of the foregoing disclosures are incorporated herein by reference in their entireties.

Although an article according to the disclosure may take on a variety of embodiments, as discussed in detail below, the use of the article by a consumer will be similar in scope. In particular, the article can be provided as a single unit or as a plurality of components that are combined by the consumer for use and then are dismantled by the consumer thereafter. Generally, a smoking article according to the disclosure can comprise a first unit that is engagable and disengagable with a second unit, the first unit comprising the resistive heating element, and the second unit comprising the electrical power source. In some embodiments, the second unit further can comprise one or more control components that actuate or regulate current flow from the electrical power source. The first unit can comprise a distal end that engages the second unit and an opposing, proximate end that includes a mouthpiece (or simply the mouthend) with an opening at a proximate end thereof. The first unit can comprise an air flow path opening into the mouthpiece of the first unit, and the air flow path can provide for passage of aerosol formed from the resistive heating element into the mouthpiece. In preferred embodiments, the first unit can be disposable. Likewise, the second unit can be reusable.

During use, the consumer initiates heating of the resistive heating element, the heat produced by the resistive heating element aerosolizes the aerosol precursor composition and, optionally, further inhalable substances. Such heating releases at least a portion of the aerosol precursor composition in the form of an aerosol (which can include any further inhalable substances included therewith), and such aerosol is provided within a space inside the cartridge that is in fluid communication with the mouthend of the cartridge.

When the consumer inhales on the mouth end of the cartridge, air is drawn through the cartridge, and the combination of the drawn air and the aerosol is inhaled by the consumer as the drawn materials exit the mouth end of the cartridge (and any optional mouthpiece present) into the mouth of the consumer. To initiate heating, the consumer may actuate a pushbutton, capacitive sensor, or similar component that causes the resistive heating element to receive electrical energy from the battery or other energy source (such as a capacitor). The electrical energy may be supplied for a pre-determined length of time or may be manually controlled. Preferably, flow of electrical energy does not substantially proceed in between puffs on the article (although energy flow may proceed to maintain a baseline temperature greater than ambient temperature—e.g., a temperature that facilitates rapid heating to the active heating temperature). In further embodiments, heating may be initiated by the puffing action of the consumer through use of various sensors, as otherwise described herein. Once the puff is discontinued, heating will stop or be reduced. When the consumer has taken a sufficient number of puffs so as to have released a sufficient amount of the inhalable substance (e.g., an amount sufficient to equate to a typical smoking experience), the cartridge can be removed from the control housing and discarded. Indication that the cartridge is spent (i.e., the aerosol precursor composition has been substantially removed by the consumer) can be provided. In some embodiments, a single cartridge can provide more than a single smoking experience and thus may provide a sufficient content of aerosol precursor composition to simulate as much as a full pack of conventional cigarettes or even more.

Smoking articles useful according to the invention can further comprise one or more components adapted to detect a cartridge status. Various embodiments of the smoking article can include a heating connection comprising a heating element and a fusible link. The term "fusible link" as used herein refers to a component adapted to fail under defined conditions and thus function as a sacrificial device in a cartridge status detection system. The heating connection is preferably in electrical connection with the power source of the smoking article such that electrical energy can be provided to the heating connection. In various embodiments, the heating connection is in electrical connection with a component adapted to measure the current flow, voltage, and/or the resistance across the heating connection. Specific embodiments of the smoking article can include a control component adapted to interpret the cartridge status based upon the measured current, voltage and/or resistance across the heating connection.

In particular embodiments, the smoking article can include components that define an electrical circuit whereby a control component is configured to controllably deliver a low power pulse from the power source to the heating connection according to one or more defined algorithms. As a non-limiting example, the control algorithm can include pulse width modulation, which can be based on comparison of a battery voltage with a lookup table. As a further non-limiting example, the control algorithm can include a constant voltage feedback loop, such as through utilization of heater voltage measurements. Specifically, in various embodiments of the smoking article, appropriate wiring can be included such that a cartridge engaging a control body defines a closed electrical circuit through which the control component can controllably deliver a low power pulse (as well as a higher power pulse). The low power pulse can be defined as an electrical current that does not exceed the limits of a fusible link as described herein. By contrast, the higher power electrical current that defines a working status of the heating element (i.e., wherein the heating element heats to a temperature sufficient to vaporize the aerosol precursor material) can exceed the limits of the fusible link.

In some embodiments, a low power pulse can have a voltage, a current, or both that is substantially similar to the same property of the higher power pulse, and pulse power can be defined by current flow duration. In particular, time can be adjusted such that the average power delivered to the circuit is constrained appropriately. In certain embodiments, the fusible link can exhibit a resistance that is lower than the resistance of the heating element. In some embodiments, the fusible link and the heating element are provided in parallel, a majority of the current entering the closed circuit can preferentially flow through the fusible link. When the duration of the electrical current flow is sufficiently long, the lower resistance fusible link will fail and thus allow all of the delivered current to pass through the heating element. Depending upon the type of material from which the fusible link is formed, a sufficiently long current flow time can be about 50 milliseconds or greater or about 100 milliseconds or greater, particularly about 50 to about 500 milliseconds. In various embodiments, the heating element can require that the current be applied for a time of about 0.5 seconds or greater or about 1 second or greater, particularly about 1 second to about 4 seconds for sufficient heating to occur. Therefore, in some embodiments, conditions defining a low power pulse can comprise a voltage, a current, or both a voltage and a current that is substantially the same as the same corresponding voltage, current, or both that is utilized for normal functioning of the heating element, and can also comprise an active flow unit time of about 45 milliseconds or less or about 25 milliseconds or less, particularly about 5 milliseconds to about 25 milliseconds.

In other embodiments, the low power pulse can be defined by a current and/or voltage that can be less than the current and/or voltage that define the working status of the heating element. For example, the electrical current that defines a working status of the heating element can exceed the current delivered by the low power pulse by a factor of 2 or more, 5 or more, or 10 or more. A voltage that defines a working voltage for the heating element can be about 2 volts to about 6 volts, about 2.5 volts to about 5.5 volts, or about 3 volts to about 5 volts. The working voltage is the voltage at which the heating element sufficiently heats to faun the desired amount of aerosol during a current flow time as described above.

A smoking article according to the disclosure further can comprise a component that is adapted to measure one or more of current, voltage, and resistance across the heating connection. For example, a current sense resistor as further described herein can be used. The control component can be adapted to interpret a status of the fusible link based upon a value provided by the current sense resistor or like component. The control component can be adapted to allow or disallow heating of a heating element in the cartridge portion engaging a control portion of the smoking article based upon the value provided by the current sense resistor. The current sense resistor can be adapted to define a first value when the fusible link is intact and thus is in a condition for transmission of the low power pulse. For example, an intact fusible link can be defined by a first measurable resistance of a specific value or value range, and sensing of the first resistance of the defined value or value range by the current sense resistor upon initiation of the low power pulse can cause the current sense resistor to output the value to the control component that is recognized thereby as defining that the cartridge is unused. A fusible link that is not intact can be defined by a second measurable resistance of a specific value or value range, and sensing of the second resistance of the defined value or value range by the current sense resistor can cause the current sense resistor to output the value to the control component that is recognized thereby as defining that the cartridge is used. The second measurable resistance can be the resistance of the heating element, and sensing of the second measurable resistance can indicate that the cartridge has been used (i.e., the heating connection has previously encountered an electrical current of conditions sufficient to activate the heating element as well as to cause the fusible link to fail).

A configuration as described above can be beneficial to prevent functioning of the control component with a non-matched cartridge (e.g., a cartridge that has been depleted of the aerosol precursor and re-filled and/or a cartridge manufactured by a different entity). Therefore, a control component can be adapted to initiate a command that does not allow for a current flow sufficient to activate the heater to be actuated if the control component interprets the measured resistance as evidence of a failed fusible link and/or a cartridge that does not include a fusible link. Thereby a user can be prevented from using the smoking article if the cartridge has been used prior to engagement of the cartridge and the control body and/or if the cartridge is manufactured by another entity that does not provide a fusible link in the cartridge as contemplated herein.

As described herein, in specific embodiments a fusible link (also referred to as a fuse) can be defined as a component that is adapted to fail (or fuse) when an electrical current of defined sufficient conditions is actuated to flow through a circuit that includes the fusible link. For example, embodiments of the fusible link are adapted to fail under electrical conditions sufficient to initiate heating by the heating element. In some embodiments, the fusible link can be a component adapted to provide a resistance when an electrical current is applied thereto. Preferably, the fusible link exhibits an electrical resistance that is significantly lower than the electrical resistance of the heating element. For example, the ratio of heater element resistance to fusible link resistance can be 1.1 or greater, 1.25 or greater, 1.5 or greater, or 2 or greater. The difference in the resistances can vary based upon the minimum measurable resolution by the current sense resistor and the conversion circuit, material properties, and working conditions. Depending upon the resistance ratio, the unit time of the low power pulse can be varied to ensure that the low power pulse is insufficient to fuse the fusible link. Accordingly, the electrical conditions described herein can be adjusted to meet material demands and working conditions within the bounds of the present disclosure.

Generally, a fusible link can comprise a metal strip or wire fuse element which has a smaller cross-section compared to the circuit conductors (wiring, for example) connecting the rest of an electrical circuit. A fusible link can be mounted between a pair of electrical terminals and in various embodiments, can be enclosed by a non-combustible housing. The fusible link can be adapted to melt directly, for example, when subjected to an electrical current of conditions that exceed the limits of the fusible link. In other embodiments, a soldered joint within the fusible link can be adapted to melt when subjected to the necessary conditions. Preferably, a fuse is adapted to easily carry a specified current and melt quickly on application of the electrical current meeting the defined conditions.

In specific embodiments, the fusible link is an electrical fusible link. In exemplary embodiments, the electrical fusible link can be defined as a short piece of conductive wire that is at least two, at least three, or at least four American wire gauge sizes smaller than the wire of the circuit that is being protected. In some embodiments, a fusible link can be fall led of two pieces of metal soldered together with a fusible alloy that is designed to melt at a specific temperature, thereby allowing the two metal pieces to separate. The term "fusible alloy" as used herein refers to a metal alloy capable of being easily melted at relatively low temperatures (e.g., a temperature that is caused by heating of the fusible link due to being subjected to an electrical current of sufficient conditions to cause the heating element to heat to a desired working temperature). In further embodiments, the fusible link can be a mechanical element, such as a connector pin or further mechanism, that can be mechanically disengaged under conditions of electrical current flow sufficient to enable heating of the heating element.

Various sizes and styles of fusible links can be used in embodiments of the cartridge detection system. In some embodiments, a fusible link is made from zinc, copper, silver, aluminum, a metal alloy, or combinations thereof. The speed at which a fuse blows is dependent on how much current flows through it and the material from which the fuse is made. Fuse bodies (or housing) can be made of ceramic, glass, plastic, fiberglass, molded mica laminates, molded compressed fiber, or other non-conductive materials known in the art. A fusible link useful according to the present disclosure can be defined by specific shapes, sizes, materials, or the like that can provide for desired properties.

In various embodiments, the heating connection is in electrical connection with a component adapted to measure the flow of electrical current across the heating connection. Current can be converted to a voltage reading, which may then be compared with a threshold, digitized, or otherwise processed by a current sense circuit. As a non-limiting example, a circuit can employ a current transformer, a hall-effect sensor, or a magnetoresistive sensor to convert current to a voltage reading. In various embodiments, a current sense resistor is used due to its simplicity and relatively low cost. Such resistors typically have low resistance values, typically less than 50 milliohms (0.050 ohms), for example. A current sensing resistor can be designed for low resistance so as to minimize power consumption. A calibrated resistance can be utilized to sense the current flowing through the current sense resistor in the form of a voltage drop which is detected and monitored by control circuitry. The voltage across the current sensing resistor then can be amplified and converted to a current value as desired. In specific embodiments, for example, a current sense resistor operating in connection with a control component can be used to measure current across the heating connection. As electrical current flows from the power source to the heating connection a current sense resistor can continuously receive and monitor the amount of current that is coming from both the power source and the heating connection. The heating connection can comprise a fusible link and a heating element which are electrically connected in parallel arrangement. As such, the total resistance of the fusible link and the heating element can be determined and evaluated by the control component to determine whether the fusible link remains intact.

An exemplary embodiment of a smoking article 10 is shown in FIG. 2 and can comprise a cartridge body 90 and a control body 80. In the illustrated embodiment, the control body 80 comprises a power source 40 (e.g., a battery), a control component 20, and a current sense resistor 170. Although FIG. 2 shows the current sense resistor 170 as being located in the control body 80, alternative embodiments have a current sense resistor 170 located in the cartridge body 90. The exact location of the current sense resistor 170 is not limiting to the present invention. Appropriate electrical wiring interconnects the battery 40, control component 20, and current sense resistor 170. The electrical connection between the power source 40 and the control component 20 allows for the control component to be configured to selectively actuate current flow from the electrical power source to other components of the smoking article. The cartridge 90 comprises a heating connection 165 which comprises a heating element 50 and a fusible link 160. The fusible link 160 is electrically aligned in parallel arrangement with the heating element 50. When the control body 80 and the cartridge 90 are engaged with one another, a closed circuit is formed such that the heating connection 165 is in electrical connection with the power source 40, the control component 20 and the current sense resistor 170. The engaged cartridge and control body is operative as otherwise described herein, and the individual components of the smoking article can be defined as otherwise described herein.

In use, a fusible link in a smoking article can be adapted to work in connection with a control component and, optionally, a current sense resistor (or similar component) to detect the status of a cartridge. More particularly, the status that is detectable is whether the cartridge is new (i.e., not previously used) or whether the cartridge has been previously activated such that heating of the heating element has occurred. The control component of the smoking article can process the cartridge status and thus determine whether use of the cartridge is authorized. An authenticated cartridge can be used normally with the engaged control body for aerosol formation. The control component can be adapted to temporarily disable the control body when engaging a non-authorized cartridge but allow normal usage to resume upon engagement with an authenticated cartridge.

An example of a method of detecting a status of a cartridge according to certain embodiments of the present disclosure is illustrated in FIG. 3. As seen therein, such method can comprise providing a control body at operation 400, the control body comprising a control component, a power source, and an optional current sense resistor, and providing a cartridge at operation 405, the cartridge comprising a heating connection which comprises a heating element, a fusible link, and an optional current sense resistor. It is understood that the current sense resistor is present in one of the control body and the cartridge. The current sense resistor is adapted to identify an indication of fusible link status. Specifically, the current sense resistor is adapted to sense a first resistance across the fusible link and a second resistance across the heating element and then relay such information to the control component.

Next, the detection method includes, at operation 410, removably engaging the cartridge with the control body so as to establish a closed circuit including the power source, the control component, the heating connection, and the current sense resistor. The method further includes, at operation 415, actuation by the control component of a low power pulse through the closed circuit. In specific embodiments, this low power pulse is defined by electrical conditions (e.g., voltage and unit time) that are insufficient to initiate heating by the heating element and also are insufficient to fuse the fusible link. For instance, the insufficient electrical conditions can comprise a working voltage applied for a sufficiently short unit time as described herein. In a return leg of the closed circuit, the low power pulse of electrical current flows through the current sense resistor. The detection method then comprises, at operation 420, measuring by the current sense resistor of the electrical current flowing from the heating connection. At operation 425, the method comprises processing the measurements from the current sense resistor through a logic flow wherein use of the cartridge is allowed or disallowed based upon the status of the fusible link. For example, a microcontroller can be adapted to interpret the resistance across the heating connection during the low power pulse so as to determine whether the fuse is intact based on the measured resistance. Sensing of a first resistance can be indicative of an intact fusible link. Sensing of a second resistance can be indicative of a fusible link that is already fused. The recognition of an intact fusible link in a cartridge identifies the cartridge as being an unused cartridge. Optionally, the method as illustrated in FIG. 3 can comprise, at operation 430, initiating a command to authorize functioning of the control body with the engaged cartridge or to temporarily disable the control body until a different cartridge is engaged. An authorization command enables flow of sufficient electrical current to heat the heating element and thus faun an aerosol.

Flow of sufficient electrical current to heat the heating element is also sufficient to cause the fusible link to fail. Subsequent samples of the failed fuse utilizing a low power pulse as described herein will be measured and processed so as to indicate a used cartridge.

Illustrated in FIG. 4 is a logic flow chart that is exemplary of a decision pathway 500 utilized by a control component to identify cartridge status. At step A, a cartridge body portion and a control body portion can be removably engaged to establish a closed circuit including a power source, a control component, a heating connection, and a current sense resistor. Upon engagement, the control component can initiate a low power pulse across the closed circuit at operation 510. At operation 520, the control component can receive the result of the detected cartridge status. After receiving the result, the control component can initiate one of two or more commands. For example, if the fusible link is intact (i.e., the cartridge is unused), the control component can authorize normal use of the cartridge at operation 530. If the fusible link has failed or is absent (i.e., the cartridge has been used), the control component can temporarily disable the control body at operation 540. At step B, the cartridge body portion and the control body portion are disengaged from one another, such as following full, normal use of a cartridge per pathway operation 530 or following temporary disabling of the control body per pathway 540. Following disengagement, at operation 550 the detection routine is reset. The cartridge body portion is then in condition to be engaged with a cartridge and the logic flow routine can be carried out again. Therefore, any new cartridge body portion engaged with the control body portion will cause the control component to run the subroutine again at point A. As seen above, in various embodiments, the control component is configured to reset when a cartridge is disengaged from the control body and the electrical circuit is interrupted. This allows for the control body to be reused with new cartridges that have been authorized for use according to the method steps described above.

In some embodiments, a similar logic flow can be utilized for sampling of the cartridge by the control body between each puff on the device. For example, after the cartridge has been authenticated, the low power pulse can be initiated between puffs on the device to confirm the working condition of the heater element. The reset of the detection routine at operation 550 after disengagement of the cartridge can still apply in such embodiments.

Although the various figures described herein illustrate the control body and the cartridge in a working relationship, it is understood that the control body and the cartridge can exist as individual devices. Accordingly, any discussion otherwise provided herein in relation to the components in combination also should be understood as applying to the control body and the cartridge as individual and separate components.

In another aspect, the invention can be directed to kits that provide a variety of components as described herein. For example, a kit can comprise a control body with one or more cartridges. A kit further can comprise a control body with one or more charging components. A kit further can comprise a control body with one or more batteries. A kit further may comprise a control body with one or more cartridges and one or more charging components and/or one or more batteries. In further embodiments, a kit may comprise a plurality of cartridges. A kit further may comprise a plurality of cartridges and one or more batteries and/or one or more charging components. The inventive kits further can include a case (or other packaging, carrying, or storage component) that accommodates one or more of the further kit components. The case can be a reusable hard or soft container. Further, the case can be simply a box or other packaging structure.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed herein and that modifications and other embodiments are intended to be included within the scope of the appended claims. Although specific terms are employed herein, they are used in a generic and descriptive sense only and not for purposes of limitation.

The invention claimed is:

1. A smoking article comprising:
a control body housing a power source and a control component; and
a cartridge body configured to removeably engage the control body and comprising an atomizer being arranged to form an aerosol from an aerosol precursor composition in response to power received by the atomizer from the power source,
wherein the control component is configured to control the power transmitted by the power source to the atomizer by outputting an electrical current flow configured to enable a command for authorization of the cartridge body, and
wherein the control component is further configured to perform the command in response to detecting the engagement of the control body with the cartridge body, the command comprising detection of a resistance associated with the cartridge body, wherein the control component is configured to determine whether the cartridge body is authorized for use with the control body based on at least in part the resistance associated with the cartridge body.

2. The smoking article of claim 1, wherein the control body houses at least one indicator configured to output a status of the power source.

3. The smoking article of claim 2, wherein the at least one indicator comprises an indicator light, such that the at least one indicator is configured to output the status of the power source by illumination of the indicator light.

4. The smoking article of claim 3, wherein illumination of the indicator light comprises illumination of the indicator light in one of a plurality of available colors selected based on the status of the power source.

5. The smoking article of claim 1, wherein the control component is configured to permit uninterrupted power transmission to the atomizer for up to a defined period during application of suction to a mouth end of the smoking article.

6. The smoking article of claim 5, wherein the control component is configured to cut off transmission of the power from the power source in response to a predefined condition of the power source.

7. The smoking article of claim 1, wherein the atomizer is a resistive atomizer.

8. The smoking article of claim 1, wherein the cartridge body comprises an air passage tube that includes an opening adapted for exit of ambient air combined with the aerosol.

9. The smoking article of claim 1, wherein the power source is rechargeable via a USB connection.

10. The smoking article of claim 1, wherein the cartridge body includes an air intake.

11. The smoking article of claim 1, wherein the control component is configured to determine that a defined time lapse has occurred since cessation of suction applied to a mouth end of the smoking article and, in response, to deactivate a function of the smoking article.

12. The smoking article of claim 1, wherein the control component is configured to:
determine suction applied to an opening in a mouth end of the smoking article;
provide the power from the power source to the atomizer in response to the suction applied to the opening in the mouth end of the smoking article;
determine cessation of the suction applied to the opening in the mouth end of the smoking article and, in response to the cessation of the suction applied to the opening in the mouth end of the smoking article, discontinue provision of the power to the atomizer; and
determine that a defined time lapse has occurred since cessation of the suction applied to the opening in the mouth end of the smoking article and deactivate a function of the smoking article.

13. The smoking article of claim 1, wherein the control component is configured to:
determine engagement of the control body with the cartridge body; and
perform a function in response to engagement of the control body with the cartridge body.

14. The smoking article of claim 13, wherein the control component is configured to determine a property of the cartridge body in response to engagement of the control body with the cartridge body.

15. The smoking article of claim 1, wherein the aerosol precursor composition comprises a polyhydric alcohol, nicotine, a flavorant, and an acid.

16. The smoking article of claim 1, wherein the control body has at least one planar side.

17. The smoking article of claim 16, wherein the control body has first and second pairs of substantially parallel sides.

18. The smoking article of claim 1, wherein the control body is configured to removeably engage the cartridge body by press-fit engagement or magnetic engagement.

19. The smoking article of claim 1, wherein the power source is selected from the group consisting of a battery, a capacitor, and combinations thereof.

20. The smoking article of claim 1, wherein the control component is configured to determine that the cartridge body is authorized for use with the control body only in an instance in which the resistance associated with the cartridge body is determined to be within a defined range of resistances.

21. The smoking article of claim 20, wherein the control component is configured to permit power transmission to the atomizer during application of suction to a mouth end of the smoking article only in an instance in which it is determined that the cartridge body is authorized for use with the control body.

22. A kit comprising packaging containing at least:
a control body according to claim 1;
at least one cartridge body according to claim 1; and
a charging component configured to engage the control body.

* * * * *